(12) United States Patent
Cho et al.

(10) Patent No.: US 11,631,731 B2
(45) Date of Patent: Apr. 18, 2023

(54) DISPLAY DEVICE

(71) Applicant: Samsung Display Co., Ltd., Yongin-si (KR)

(72) Inventors: Young Jin Cho, Seoul (KR); Ji Su Na, Yongin-si (KR); Joong-Soo Moon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 128 days.

(21) Appl. No.: 17/172,383

(22) Filed: Feb. 10, 2021

(65) Prior Publication Data
US 2021/0376042 A1    Dec. 2, 2021

(30) Foreign Application Priority Data
Jun. 2, 2020   (KR) .................. 10-2020-0066615

(51) Int. Cl.
*H01L 27/32*       (2006.01)
(52) U.S. Cl.
CPC ........ *H01L 27/3276* (2013.01); *H01L 27/323* (2013.01); *H01L 27/3262* (2013.01)
(58) Field of Classification Search
CPC .. G09G 3/3266; G09G 3/3233; G09G 3/3225; G09G 3/3208; G09G 3/3258; H01L 27/3276; H01L 27/323; H01L 27/3262
See application file for complete search history.

(56) References Cited

U.S. PATENT DOCUMENTS

| | | | | |
|---|---|---|---|---|
| 10,559,253 | B1* | 2/2020 | Li | G09G 3/3225 |
| 10,636,859 | B2* | 4/2020 | Park | H01L 27/1255 |
| 10,741,124 | B2* | 8/2020 | Xiong | H01L 27/3276 |
| 10,748,978 | B2* | 8/2020 | Lim | H01L 27/3276 |
| 10,854,124 | B2* | 12/2020 | Yang | G09G 3/20 |
| 10,964,761 | B2* | 3/2021 | Lee | H01L 27/3276 |
| 11,004,926 | B2* | 5/2021 | Na | H01L 51/5256 |
| 2018/0129106 | A1 | 5/2018 | Gao et al. | |
| 2020/0319519 | A1* | 10/2020 | Yang | G02F 1/136286 |

FOREIGN PATENT DOCUMENTS

| | | |
|---|---|---|
| KR | 10-1539953 B1 | 7/2015 |
| KR | 10-2017-0045459 A | 4/2017 |
| KR | 10-2018-0050372 A | 5/2018 |
| KR | 10-2019-0027717 A | 3/2019 |
| KR | 10-2019-0098295 A | 8/2019 |

\* cited by examiner

*Primary Examiner* — Sardis F Azongha
(74) *Attorney, Agent, or Firm* — Lewis Roca Rothgerber Christie LLP

(57) ABSTRACT

In a display device including a notch portion of a non-emission region, the display device includes: a plurality of pixels; a plurality of scan lines connected to the plurality of pixels; and a load adjusting portion connected to the scan lines on both sides of the notch portion and adjacent to an upper end portion of the notch portion, wherein the load adjusting portion includes: a load adjusting wiring connected to the scan lines on both sides of the notch portion; a first load adjusting electrode in a different layer from the load adjusting wiring and overlapping the load adjusting wiring; and a second load adjusting electrode in a different layer from the load adjusting wiring and the first load adjusting electrode and overlapping the load adjusting wiring.

20 Claims, 23 Drawing Sheets

DISPLAY DEVICE

CROSS-REFERENCE TO RELATED APPLICATION

The present application claims priority to and the benefit of Korean Patent Application No. 10-2020-0066615 filed in the Korean Intellectual Property Office on Jun. 2, 2020, the entire content of which is incorporated herein by reference.

BACKGROUND

1. Field

Aspects of some example embodiments of the present disclosure relate to a display device.

2. Description of the Related Art

A display device is a device that displays images on a display screen or display panel, and includes, for example, a liquid crystal display (LCD), an organic light emitting diode (OLED), and the like. Display devices may be utilized in various electronic devices such as mobile phones, navigation devices, digital cameras, electronic books, portable game machines, tablet personal computers, and various terminals.

A display device may generally include a plurality of pixels arranged in a row direction and a column direction (e.g., a matrix configuration). Within each pixel, various elements such as transistors and capacitors and various wirings capable of supplying signals to these elements may be included.

The display device may include a notch portion located at the upper end. The notch portion is a non-emission region, and a camera, a sensor, etc. may be located in the notch portion. Because pixels are generally not arranged in the notch portion, the number of pixels connected to the wiring located on both sides of the notch portion is very small compared to other regions. Therefore, the wiring located on both sides of the notch portion has a load difference compared to the wiring located in other regions, and thus a luminance deviation may occur.

The above information disclosed in this Background section is only for enhancement of understanding of the background and therefore the information discussed in this Background section does not necessarily constitute prior art.

SUMMARY

Aspects of some example embodiments include a display device that may prevent or reduce the occurrence of the luminance deviation depending on the position of various components (e.g., wirings or other active or passive electrical components).

According to some example embodiments of the present disclosure, a display device including a notch portion of a non-emission region includes: a plurality of pixels; a plurality of scan lines connected to the plurality of pixels; and a load adjusting portion connected to the scan lines on both sides of the notch portion and adjacent to an upper end portion of the notch portion, wherein the load adjusting portion includes: load adjusting wiring connected to the scan lines on both sides of the notch portion; a first load adjusting electrode in a different layer from the load adjusting wiring and overlapping the load adjusting wiring; and a second load adjusting electrode in a different layer from the load adjusting wiring and the first load adjusting electrode and overlapping the load adjusting wiring.

According to some example embodiments, the load adjusting portion may be further adjacent to a lower end portion of the notch portion.

According to some example embodiments, the scan line and the load adjusting wiring may extend in a first direction, the first load adjusting portion may extend in a second direction crossing the first direction, and the second load adjusting portion may be entirely on the load adjusting portion.

According to some example embodiments, the display device may further include: a first insulating layer between the first load adjusting electrode and the load adjusting wiring; and a second insulating layer between the second load adjusting electrode and the load adjusting wiring, wherein the first load adjusting electrode may be below the load adjusting wiring, and the second load adjusting electrode may be on the load adjusting wiring.

According to some example embodiments, the number of pixels connected to the scan lines on both sides of the notch portion may be smaller than the number of pixels connected to the scan lines on the remaining region except for both sides of the notch portion.

According to some example embodiments, the display device may further include: a plurality of signal lines connected to the plurality of pixels; a connection wiring portion along the edge of the notch portion to connect a signal line at the left of the notch portion and a signal line at the right of the notch portion; and a load connection wiring connecting the scan line and the load adjusting portion, and the load connection wiring may be adjacent to the connection wiring portion.

According to some example embodiments, the connection wiring portion may include a first connection wire, a second connection wire, a third connection wire and a fourth connection wire in different layers, the first connection wire and the second connection wire, which are in the adjacent layers, may not overlap each other on a cross-section, and the third connection wire and the fourth connection wire, which are in the adjacent layers, may not overlap each other on a cross-section.

According to some example embodiments, the display device may further include a polycrystalline semiconductor layer, a first gate conductive layer, a second gate conductive layer, an oxide semiconductor layer, a third gate conductive layer, a first data conductive layer, and a second data conductive layer, which are sequentially deposited, the first connection wire may be in the first gate conductive layer, the second connection wire may be in the second gate conductive layer, the third connection wire may be in the first data conductive layer, and the fourth connection wire may be in the second data conductive layer.

According to some example embodiments, the load adjusting wiring may be in the third gate conductive layer, the first load adjusting electrode may be in the second gate conductive layer, and the second load adjusting electrode may be in the first data conductive layer.

According to some example embodiments, the load connection wiring may be in the third gate conductive layer to be formed integrally with the load adjusting wiring, and may not overlap the connection wiring portion.

According to some example embodiments, the display device may further include a polycrystalline semiconductor layer, a first gate conductive layer, a second gate conductive layer, an oxide semiconductor layer, a third gate conductive layer, a first data conductive layer, and a second data conductive layer, which are sequentially deposited, and the load connection wiring may be in the second data conductive layer.

According to some example embodiments, the load connection wiring may overlap the connection wiring portion.

According to some example embodiments, the connection wiring portion may include a first connection wire, a second connection wire, a third connection wire, and a fourth connection wire, which are in different layers, the first connection wire may be in the first gate conductive layer, the second connection wire may be in the second gate conductive layer, the third connection wire may be in the third gate conductive layer, and the fourth connection wire may be in the first data conductive layer.

According to some example embodiments, the load adjusting wiring may be in the second gate conductive layer, the first load adjusting electrode may be in the polycrystalline semiconductor layer, and the second load adjusting electrode may be in the first data conductive layer.

According to some example embodiments, the load adjusting wiring may be in the third gate conductive layer, the first load adjusting electrode may be in the second gate conductive layer, and the second load adjusting electrode may be in the first data conductive layer.

According to some example embodiments, the display device may further include a light emission control line, a bypass control line, and an initialization control line connected to the plurality of pixels, the scan line may include a first scan line and a second scan line, and the load adjusting portion may be connected to the first scan line or the second scan line.

According to some example embodiments, the connection wiring portion may include a first connection wire connecting a light emission control line at the left of the notch portion and a light emission control line at the right of the notch portion, a second connection wire connecting a bypass control line at the left of the notch portion and a bypass control line at the right of the notch portion, a third connection wire connecting an initialization control line at the left of the notch portion and an initialization control line at the right of the notch portion, and a fourth connection wire connecting a second scan line at the left of the notch portion and a second scan line at the right of the notch portion, and the load adjusting portion may be connected to the first scan line.

According to some example embodiments, each of the plurality of pixels may include: a light emitting diode (LED) connected between a driving voltage line to which a driving voltage is applied and a common voltage line to which a common voltage is applied; a driving transistor connected between the driving voltage line and the light emitting diode (LED); a second transistor connected between a first electrode of the driving transistor connected to the driving voltage line and a data line to which a data voltage is applied; a third transistor connected between a second electrode of the driving transistor connected to the light emitting diode (LED) and a gate electrode of the driving transistor; and a fourth transistor connected between a gate electrode of the driving transistor and a first initialization voltage line to which a first initialization voltage is applied, the driving transistor and the second transistor may include a polycrystalline semiconductor, and the third transistor and the fourth transistor may include an oxide semiconductor.

According to some example embodiments, the gate electrode of the second transistor may be connected to the first scan line, the gate electrode of the third transistor may be connected to the second scan line, and the gate electrode of the fourth transistor may be connected to the initialization control line.

According to some example embodiments, each of the plurality of pixels may further include: a fifth transistor connected between the driving voltage line and the driving transistor; and a seventh transistor connected between the light emitting diode (LED) and a second initialization voltage line to which a second initialization voltage is applied, the gate electrode of the fifth transistor may be connected to the light emission control line, and the gate electrode of the seventh transistor may be connected to the bypass control line.

The display device according to some example embodiments may further include at least one of a camera, a proximity sensor, an illuminance sensor, a gesture sensor, a motion sensor, a fingerprint sensor, or a biological sensor, or a combination thereof, positioned at the notch portion.

A display device according to some example embodiments of the present disclosure may include: a plurality of pixels; a plurality of scan lines connected to the plurality of pixels; and a load adjusting portion connected to scan lines on both sides of the notch portion, wherein the load adjusting portion includes load adjusting wiring connected to the scan lines on both sides of the notch portion; a first load adjusting electrode under the load adjusting wiring and overlapping the load adjusting wiring; a first insulating layer between the load adjusting wiring and the first load adjusting electrode; a second load adjusting electrode on the load adjusting wiring and overlapping the load adjusting wiring; and a second insulating layer between the load adjusting wiring and the second load adjusting electrode.

According to some example embodiments, a luminance deviation between the notch portion at the periphery of the display device and other regions may be prevented or reduced.

DETAILED DESCRIPTION

Figure 1:
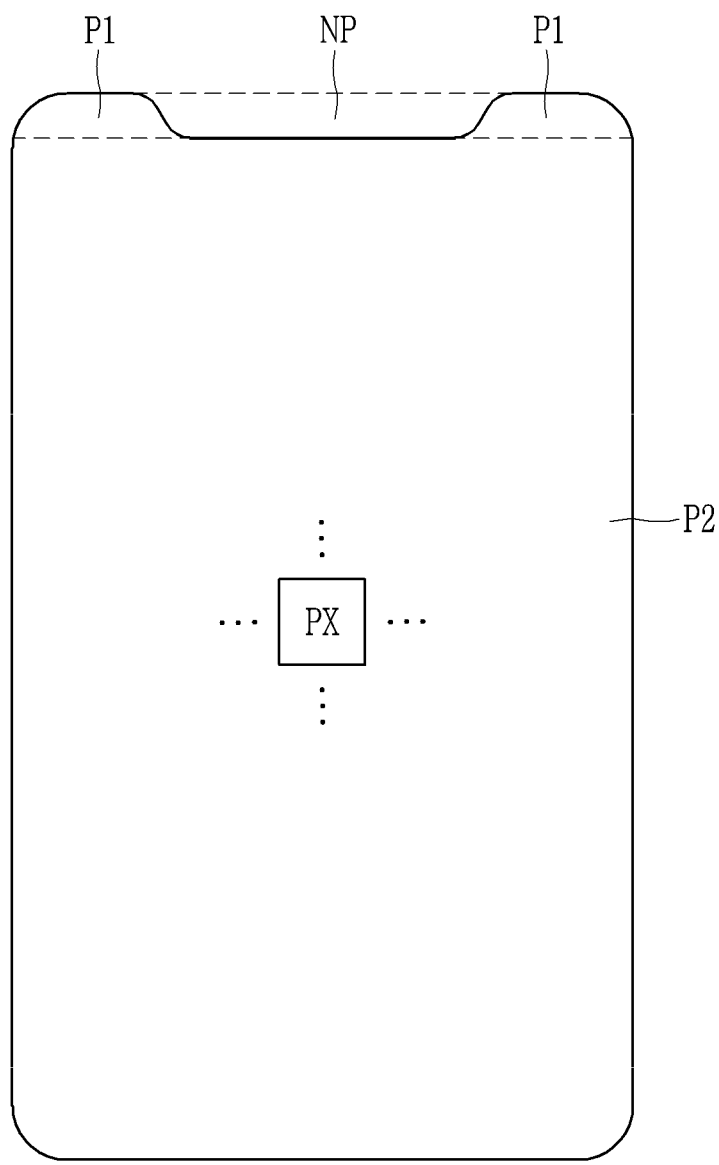
FIG. 1 is a top plan view schematically showing a display device according to some example embodiments.

Further details of embodiments according to the present invention will be described more fully hereinafter with reference to the accompanying drawings, in which example embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

In addition, the size and thickness of each configuration shown in the drawings are arbitrarily shown for better understanding and ease of description, but embodiments according to the present invention are not limited thereto. In the drawings, the thickness of layers, films, panels, regions, etc., are exaggerated for clarity. In the drawings, for better understanding and ease of description, the thickness of some layers and areas is exaggerated.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

The display device according to some example embodiments is described with reference to FIG. 1.

FIG. 1 is a top plan view schematically showing a display device according to some example embodiments.

As shown in FIG. 1, a display device 1000 according to some example embodiments includes a notch portion NP.

The notch portion NP may be a non-emission region and may be located at the center of the upper end of the display device 1000. However, the position of the notch portion NP is not limited thereto and may be variously changed. For example, the notch portion NP may be located at the lower end of the display device 1000. The planar shape of the notch portion NP may be approximately quadrangular. The planar shape of the notch portion NP may have a trapezoid shape whose the upper side is longer than the lower side. Both sides (left and right) edges of the notch portion NP may be formed of a curved line. The notch portion NP is a region in which a screen is not displayed, and components having various functions may be located in the notch portion NP. For example, at least one of a camera, a proximity sensor, an illuminance sensor, a gesture sensor, a motion sensor, a fingerprint recognition sensor, or a biometric sensor, or a combination thereof, may be located on the notch portion NP.

A screen may be displayed in the regions other than the notch portion NP. The first region P1 may be located on both sides (left and right) of the notch portion NP. The second region P2 may be located below the notch portion NP and the first region P1. The first region P1 and the second region P2 may be light emission regions. At this time, the screen may be displayed on most of the first region P1 and the second region P2. However, in some regions of the edge of the first region P1 and the second region P2, a region in which the screen is not displayed may be provided, which is called a bezel region.

The display device 1000 may include a plurality of pixels PX. A plurality of pixels PX may be located in a matrix form along a row direction and a column direction and may receive an image signal, thereby displaying the image. However, the arrangement form of a plurality of pixels PX is not limited thereto and may be variously changed. According to some example embodiments, the display device 1000 may further include a plurality of wires. The wiring may be made of a plurality of scan lines, a plurality of control lines, a plurality of data lines, a plurality of driving voltage lines, and the like. Each of these wires may transmit a scan signal, a control signal, a data signal, and a driving voltage. A plurality of wires may be located to cross each other in a row direction or a column direction. In addition, each pixel PX may include a plurality of transistors, a capacitor, and at least one light emitting diode (LED) connected to a plurality of wires. That is, the display device 1000 may be made of an organic light emitting diode display. However, the type of the display panel 1000 is not limited thereto and may be made of various types of display devices. For example, the display device 1000 may be made of a liquid crystal display, an electrophoretic display, or an electrowetting display device. In addition, the display device 1000 according to some example embodiments may also consist of a next-generation display device such as a micro-light-emitting diode (LED) (Micro LED) display device, a quantum dot light emitting diode (LED) (QLED) display device, or a quantum dot organic light emitting diode (QD-OLED) display.

A plurality of pixels PX may be located in the first region P1 and the second region P2. The pixel PX is not located in the notch portion NP. A plurality of pixels located in the same row may be connected to the same wiring. At this time, the wiring may be extended in the row direction. For example, a plurality of pixels located in the same row may be connected to the same scan line. Also, a plurality of pixels located in the same column can be connected to the same wiring. At this time, the wiring may be extended in the column direction. For example, a plurality of pixels located in the same column may be connected to the same data line.

In the second region P2, a similar number of pixels PXs may be located for each pixel row. Therefore, the load of the wiring connected to each pixel row is almost the same. The number of pixels PX located in one pixel row in the first region P1 is very small compared to the number of pixels PX located in one pixel row in the second region P2. This is because the notch portion NP is located between the first regions P1 and the pixel PX is not located in the notch portion NP. Therefore, the load of the wiring connected to each pixel row in the first region P1 may be different from the load of the wiring connected to each pixel row in the second region P2.

The structure of the display device for reducing the difference in the load of the wiring in the first region PA1 and the second region PA2, according to some example embodiments, is further described with reference to FIG. 2 to FIG. 5.

Figure 2:
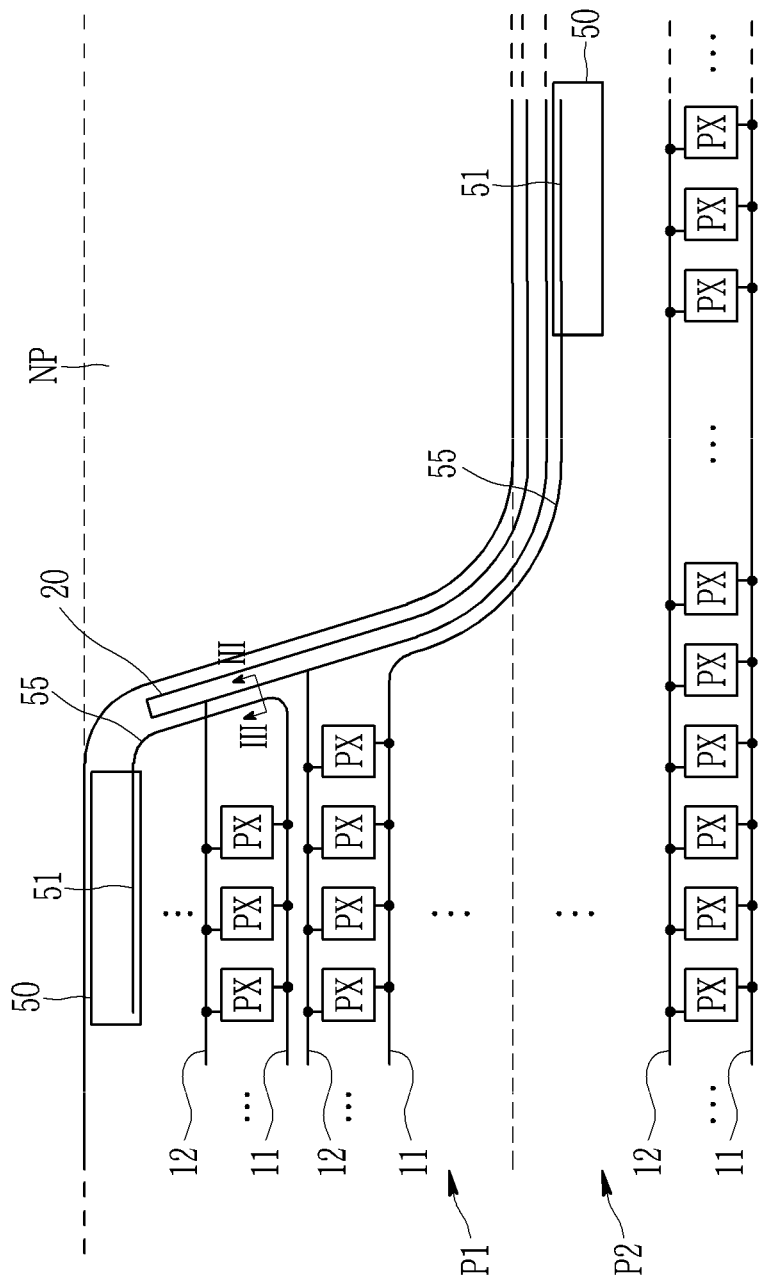
FIG. 2 is a top plan view showing a partial region of a display device according to some example embodiments.
Figure 3:
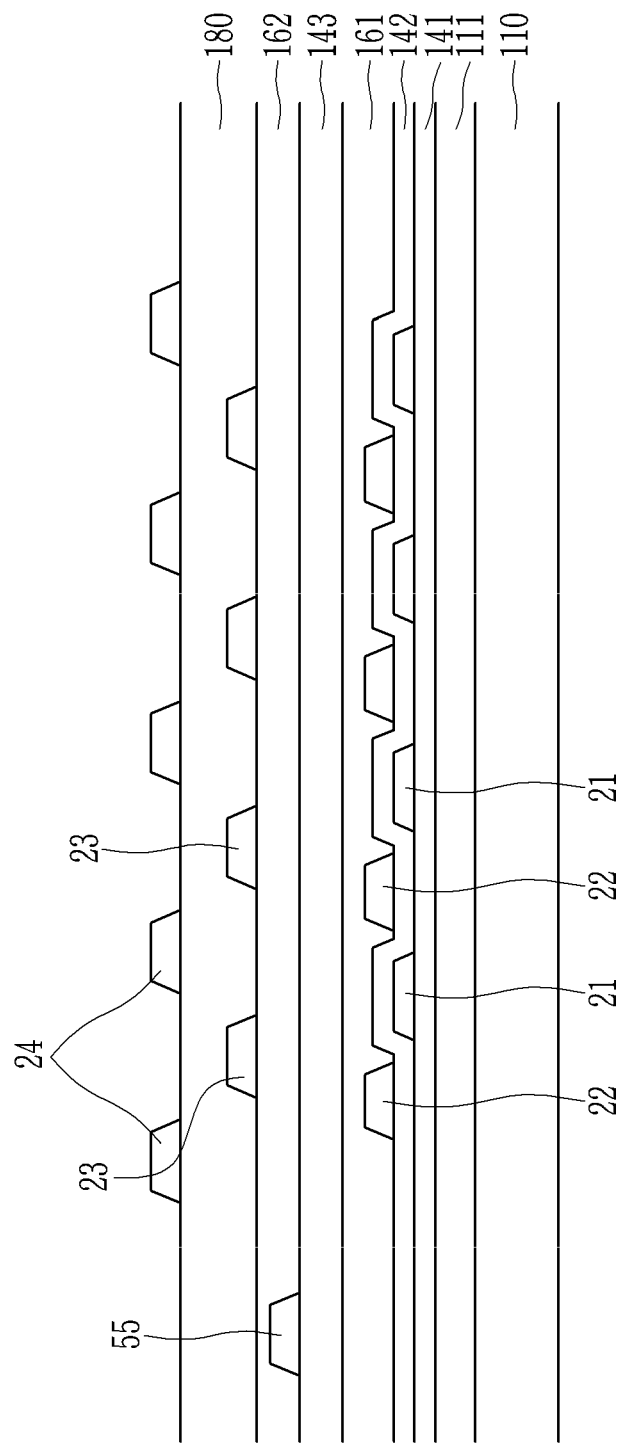
FIG. 3 is a cross-sectional view taken along a line III-III of FIG. 2.
Figure 4:
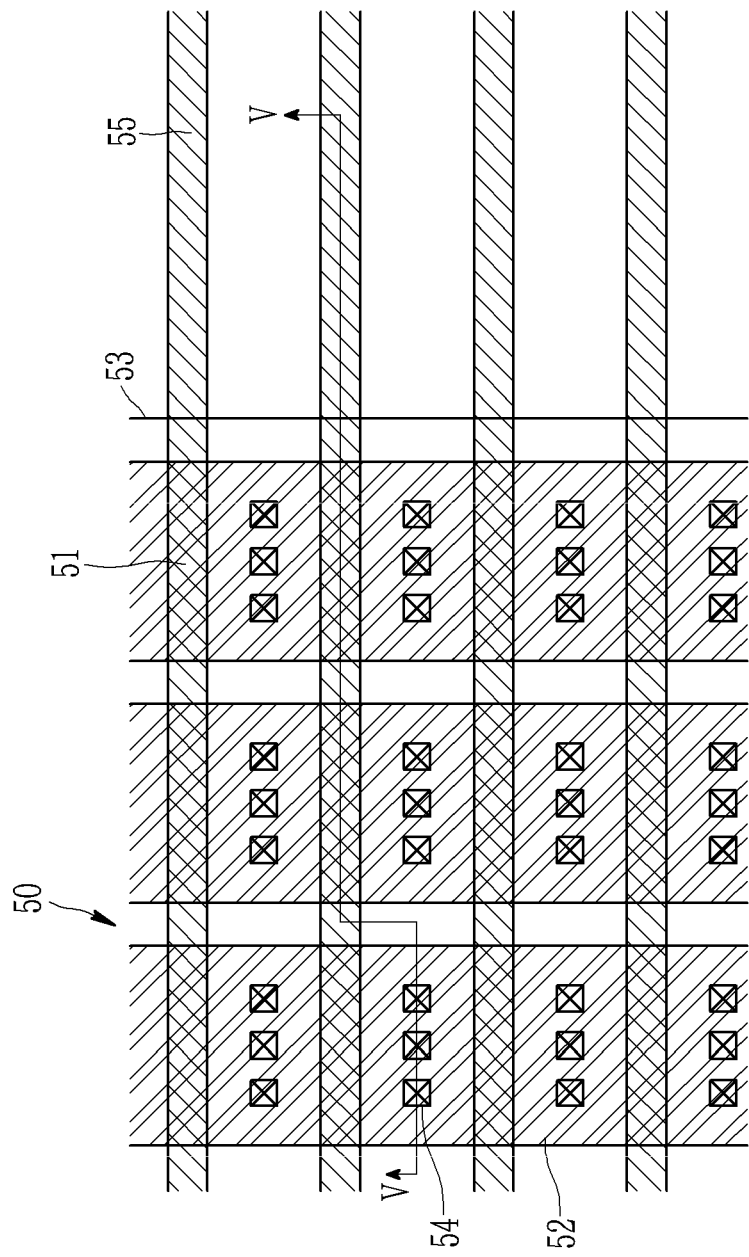
FIG. 4 is a top plan view showing a partial region of a display device according to some example embodiments.
Figure 5:
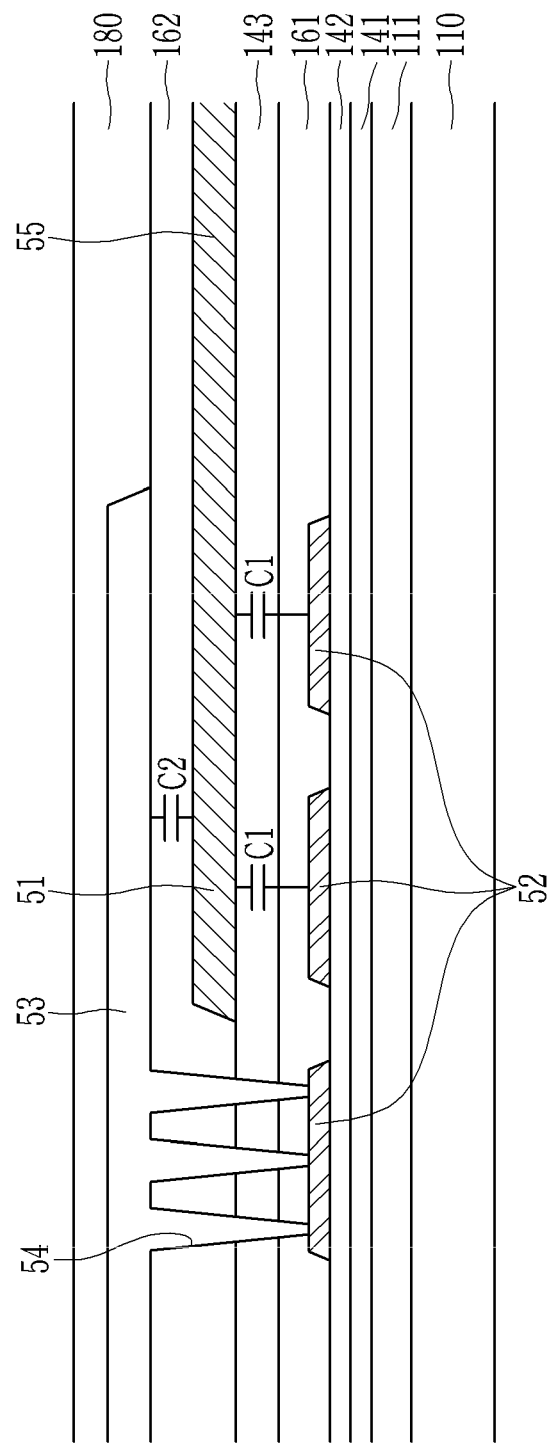
FIG. 5 is a cross-sectional view taken along a line V-V of FIG. 4.

FIG. 2 is a top plan view showing a partial region of a display device according to some example embodiments, and FIG. 3 is a cross-sectional view taken along a line III-III of FIG. 2. FIG. 4 is a top plan view showing a partial region of a display device according to some example embodiments, and FIG. 5 is a cross-sectional view taken along a line V-V of FIG. 4. FIG. 2 to FIG. 5 show the periphery of the notch portion of the display device according to some example embodiments. FIG. 2 to FIG. 5 shows the left edge periphery of the notch portion of the display device according to some example embodiments, but according to some example embodiments, the right edge periphery of the notch portion may be symmetrical to the left.

As shown in FIG. 2, the display device according to some example embodiments includes a plurality of pixels PX, and a plurality of pixels PX are arranged in a row direction and a column direction.

The display device according to some example embodiments may further include a plurality of scan lines 11. A plurality of scan lines 11 may extend in a first direction on a plane, and the first direction may be the row direction. The pixels PX located in the same row are connected to the same scan line 11. For example, the scan line 11 may be formed of a first scan signal line transmitting a first scan signal. The number of pixels PX connected to the scan lines 11 located on both sides of the notch portion NP is less than the number of pixels PX connected to the scan lines 11 located on the rest of the regions excluding both sides of the notch portion NP.

That is, the number of pixels PX connected to the scan line 11 located in the first region P1 is less than the number of pixels PX connected to the scan line 11 positioned in the second region P2. The scan line 11 located in the first region P1 located at the left with respect to the notch portion NP may not be connected to the scan line 11 located in the first region P1 located at the right. A driving unit that supplies signals to the scan line 11 may be located at both edges of the display device, and the scan line 11 may receive the signals from the driving units on both sides. This is referred to as bilateral driving.

The display device according to some example embodiments may further include a load adjusting portion 50 capable of controlling the load of the scan lines 11 located at both sides of the notch portion NP. The load adjusting portion 50 may control the scan lines 11 located at both sides of the notch portion NP. That is, the load adjusting portion 50 may be connected to the scan line 11 located at the first region P1 and may not be connected to the scan line 11 located at the second region P2. The load adjusting portion 50 may be located adjacent to the upper end portion of the notch portion NP. The load adjusting portion 50 is shown to be located at the left of the upper end portion of the notch portion NP, but according to some example embodiments, the load adjusting portion 50 may be further located at the right of the upper end portion of the notch portion NP. Also, the load adjusting portion 50 may be further located adjacent to the lower end portion of the notch portion NP. The part among the plurality of scan lines 11 located in the first region P1 may be connected to the load adjusting portion 50 adjacent to the upper end portion of the notch portion NP, and the other part may be connected to the load adjusting portion 50 located at the lower end portion of the notch portion NP. For example, the scan line 11 located at the upper side based on the center region of the first region P1 may be connected to the load adjusting portion 50 adjacent to the upper end portion of the notch portion NP. The scan line 11 located at the lower side based on the center region of the first region P1 may be connected to the load adjusting portion 50 adjacent to the lower end portion of the notch portion NP.

The display device according to some example embodiments may further include load connection wiring 55 connecting the scan line 11 and the load adjusting portion 50. The load adjusting portion 50 may include load adjusting wiring 51. The load adjusting wiring 51 may be extended in the first direction on a plane and the first direction may be the row direction. That is, the load adjusting wiring 51 may be extended in the direction parallel to the scan line 11. The load connection wiring 55 may be connected to the load adjusting wiring 51. In this case, the load connection wiring 55 may be located on the same layer as and formed integrally with the load adjusting wiring 51. However, it is not limited thereto, and the load connection wiring 55 may be located on a different layer from the load adjusting wiring 51. The load connection wiring 55 may be located along the edge of the notch portion NP. The load connection wiring 55 may be located along the left edge and the right edge of the notch portion NP.

The display device according to some example embodiments may further include a plurality of signal lines 12. The plurality of signal lines 12 may be extended in the first direction on a plane and the first direction may be the row direction. The pixels PX located in the same row are connected to the same signal line 12. For convenience, one signal line 12 is shown to be located for each pixel row, however a plurality of signal lines 12 may be located for each pixel row. That is, one pixel PX may be connected to a plurality of signal lines 12. For example, the signal line 12 may include a light emission control line transmitting a light emission control signal, a bypass control line transmitting a bypass signal, an initialization control line transmitting an initialization control signal, and a second scan line transmitting a second scan signal. With respect to the notch portion NP, the signal line 12 located in the first region P1 located at the left may be connected to the signal line 12 located in the first region P1 located at the right. The driving unit supplying the signal to the signal line 12 may be located on one side edge of the display device, and the signal line 12 may receive the signal from the driving unit of one side. This is referred to as one-sided driving. For example, a light emission driver generating the light emission control signal to be transmitted to the light emission control line and an initialization driving unit generating the initialization control signal to be transmitted to the initialization control line may be located on the left edge of the display device. A bypass driving unit generating the bypass signal to be transmitted to the bypass control line and a second scan driver generating the second scan signal to be transmitted to the second scan line may be located on the right edge of the display device. To transmit the signal from the driving unit located on the edge of one side to the edge of the other side, the signal line 12 located in the first region P1 of the left of the notch portion NP and the signal line 12 located in the first region P1 of the right of the notch portion NP may be connected.

The display device according to some example embodiments may further include a connection wiring portion 20 connecting the signal line located at the left of the notch portion NP and the signal line located at the right of the notch portion NP. The connection wiring portion 20 may be located along the edge of the notch portion NP. The connection wiring portion 20 may be located along the left edge, the lower edge and the right edge of the notch portion NP. The load connection wiring 55 may be located to be adjacent to the connection wiring portion 20. In this case, the load connection wiring 55 may not overlap the connection wiring portion 20.

As shown in FIG. 3, the connection wiring portion 20 may include a first connection wire 21, a second connection wire 22, a third connection wire 23, and a fourth connection wire 24, which are located on the different layers from each other. In this case, the load connection wiring 55 may not overlap the first connection wire 21, the second connection wire 22, the third connection wire 23, and the fourth connection wire 24.

A buffer layer 111 may be located on the substrate 110. The buffer layer 111 may have a single layer or multi-layered structure. The buffer layer 111 may include an organic insulating material or an inorganic insulating material. A first gate insulating layer 141 may be located on the buffer layer 111. The first gate insulating layer 141 may include a silicon nitride, a silicon oxide, etc. According to some example embodiments, a polycrystalline semiconductor layer may be located between the buffer layer 111 and the first gate insulating layer 141. That is, a polycrystalline semiconductor layer collectively refers a polycrystalline semiconductor, etc. located between the buffer layer 111 and the first gate insulating layer 141. The polycrystalline semiconductor layer may include a polycrystalline semiconductor material.

A second gate insulating layer 142 may be located on the first gate insulating layer 141. The second gate insulating layer 142 may include a silicon nitride, a silicon oxide, etc. A first gate conductive layer including the first connection wire 21 may be located between the first gate insulating layer 141 and the second gate insulating layer 142. That is, the first connection wire 21 may be located in the first gate conductive layer. The first gate conductive layer collectively refers to wiring, etc. located between the first gate insulating layer 141 and the second gate insulating layer 142.

A first interlayer insulating layer 161 may be located on the second gate insulating layer 142. The first interlayer insulating layer 161 may include a silicon nitride, a silicon oxide, etc. A second gate conductive layer including the second connection wire 22 may be located between the second gate insulating layer 142 and the first interlayer insulating layer 161. That is, the second connection wire 22 may be located in the second gate conductive layer. The second gate conductive layer collectively refers to wiring, etc. located between the second gate insulating layer 142 and the first interlayer insulating layer 161.

The first connection wire 21 and the second connection wire 22 may be located in layers adjacent to each other via the second gate insulating layer 142 interposed therebetween. The first connection wire 21 and the second connection wire 22 may not overlap each other on a cross-section. If the wires arranged in the adjacent layers overlap each other, the wires may be shorted. In the display device according to some example embodiments, by arranging the first connection wiring 21 and the second connection wire 22 so as to not be overlapped, a short circuit between the first connection wire 21 and the second connection wire 22 may be prevented or reduced.

A third gate insulating layer 143 may be arranged on the first interlayer insulating layer 161. According to some example embodiments, an oxide semiconductor layer may be located between the first interlayer insulating layer 161 and the third gate insulating layer 143. The oxide semiconductor layer may include an oxide semiconductor, etc. located between the first interlayer insulating layer 161 and the third gate insulating layer 143. The oxide semiconductor layer may include at least one among a primary metal oxide such as indium (In) oxide, tin (Sn) oxide, or zinc (Zn) oxide, a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a ternary metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor layer may include Indium-Gallium-Zinc Oxide (IGZO) among In—Ga—Zn-based oxides.

A second interlayer insulating layer 162 located on the third gate insulating layer 143. A third gate conductive layer including the load connection wiring 55 may be located between the third gate insulating layer 143 and the second interlayer insulating layer 162. That is, the load connection wiring 55 may be located in the third gate conductive layer. The third gate conductive layer collectively refers to wiring, etc. located between the third gate insulating layer 143 and the second interlayer insulating layer 162.

A third interlayer insulating layer 180 may be located on the second interlayer insulating layer 162. A first data conductive layer including the third connection wire 23 may be located between the second interlayer insulating layer 162 and the third interlayer insulating layer 180. That is, the third connection wire 23 may be located in the first data conductive layer. The first data conductive layer collectively refers to wiring, etc. located between the second interlayer insulating layer 162 and the third interlayer insulating layer 180.

A second data conductive layer including the fourth connection wire 24 may be located on the third interlayer insulating layer 180. That is, the fourth connection wire 24 may be located in the second data conductive layer. The second data conductive layer collectively refers to wiring, etc. located on the third interlayer insulating layer 180.

The third connection wire 23 and the fourth connection wire 24 may be located in layers adjacent to each other via the third interlayer insulating layer 180 interposed therebetween. The third connection wire 23 and the fourth connection wire 24 may not overlap each other on a cross-section. In the display device according to some example embodiments, by arranging the third connection wire 23 and the fourth connection wire 24 so as to not be overlapped, a short circuit between the third connection wire 23 and the fourth connection wire 24 may be prevented or reduced.

As shown in FIG. 4 and FIG. 5, the load adjusting portion 50 is connected to the load connection wiring 55. The load adjusting portion 50 may include the load adjusting wiring 51, the first load adjusting electrode 52, and the second load adjusting electrode 53.

A plurality of load adjusting wires 51 may be extended in the first direction on a plane and the first direction may be the row direction. The load adjusting wiring 51 may be extended in the direction parallel to the scan line 11. The load adjusting wiring 51 may be located in the third gate conductive layer. The load adjusting wiring 51 may be located between the third gate insulating layer 143 and the second interlayer insulating layer 162. The load adjusting wiring 51 may be connected to the load connection wiring 55. The load adjusting wiring 51 may be located on the same layer as the load connection wiring 55. That is, the load adjusting wiring 51 and the load connection wiring 55 may be located in the third gate conductive layer. The load adjusting wiring 51 and the load connection wiring 55 may be formed integrally. The load adjusting wiring 51 may be connected to the scan line 11 through the load connection wiring 55. Accordingly, the signal applied to the scan line 11 may be transmitted to the load adjusting wiring 51.

A plurality of first load adjusting electrodes 52 may be extended in a second direction on a plane, and the second direction may cross the first direction. For example, the second direction may be a column direction. Accordingly, the first load adjusting electrode 52 may cross the load adjusting wiring 51. The first load adjusting electrode 52 may overlap the load adjusting wiring 51. The first load adjusting electrode 52 may be located on the different layer from the load adjusting wiring 51. The first load adjusting electrode 52 may be located in the second gate conductive layer. The first load adjusting electrode 52 may be located between the second gate insulating layer 142 and the first interlayer insulating layer 161. The first load adjusting electrode 52 may be located below the load adjusting wiring 51. An insulating layer may be located between the first load adjusting electrode 52 and the load adjusting wiring 51. For example, the first interlayer insulating layer 161 and the third gate insulating layer 143 may be located between the first load adjusting electrode 52 and the load adjusting wiring 51.

The second load adjusting electrode 53 may be entirely located on the load adjusting portion 50. The second load adjusting electrode 53 may overlap the load adjusting wiring 51. The second load adjusting electrode 53 may be located on the different layer from the load adjusting wiring 51. The second load adjusting electrode 53 may be located in the first data conductive layer. The second load adjusting electrode 53 may be located between the second interlayer insulating layer 162 and the third interlayer insulating layer 180. The second load adjusting electrode 53 may be located on the load adjusting wiring 51. An insulating layer may be located between the second load adjusting electrode 53 and the load adjusting wiring 51. For example, the second interlayer insulating layer 162 may be located between the second load adjusting electrode 53 and the load adjusting wiring 51.

An insulating layer may be located between the first load adjusting electrode 52 and the second load adjusting electrode 53. For example, the first interlayer insulating layer 161, the third gate insulating layer 143, and the second interlayer insulating layer 162 may be located between the first load adjusting electrode 52 and the second load adjusting electrode 53. The insulating layer located between the first load adjusting electrode 52 and the second load adjusting electrode 53 may include an opening 54. The opening 54 may be formed in the first interlayer insulating layer 161, the third gate insulating layer 143, and the second interlayer insulating layer 162. The opening 54 does not overlap the load adjusting wiring 51. The second load adjusting electrode 53 may be located in the opening 54. The second load adjusting electrode 53 may be connected to the first load adjusting electrode 52 through the opening 54. The first load adjusting electrode 52 and the second load adjusting electrode 53 overlap each other, and the first load adjusting electrode 52 and the second load adjusting electrode 53 may be connected at the portion where the first load adjusting electrode 52 and the second load adjusting electrode 53 do not overlap the load adjusting wiring 51. A driving voltage ELVDD may be applied to the first load adjusting electrode 52 and/or the second load adjusting electrode 53. If the driving voltage ELVDD is applied to the first load adjusting electrode 52, the driving voltage ELVDD may also be transmitted to the second load adjusting electrode 53. If the driving voltage ELVDD is applied to the second load adjusting electrode 53, the driving voltage ELVDD may also be transmitted to the first load adjusting electrode 52. The driving voltage ELVDD may be applied to the first load adjusting electrode 52 and the second load adjusting electrode 53.

The first load adjusting electrode 52 and the load adjusting wiring 51 overlap via the insulating layer interposed therebetween, thereby forming a first capacitor C1. Also, the second load adjusting electrode 53 and the load adjusting wiring 51 overlap each other via the insulating layer interposed therebetween, thereby forming a second capacitor C2. In this case, the capacitance of the first capacitor C1 may be determined by the overlapping area of the first load adjusting electrode 52 and the load adjusting wiring 51, the thickness of the insulating layer located between the first load adjusting electrode 52 and the load adjusting wiring 51, etc. The capacitance of the second capacitor C2 may be determined by the overlapping area of the second load adjusting electrode 53 and the load adjusting wiring 51, the thickness of the insulating layer located between the second load adjusting electrode 53 and the load adjusting wiring 51, etc. By controlling the capacitance of the first capacitor C1 and the second capacitor C2 of the load adjusting portion 50, the load of the scan line 11 connected to the load adjusting portion 50 may be changed. Accordingly, by controlling the capacitance of the capacitor of the load adjusting portion 50 connected to the scan line 11 located in the first region P1, the load of the scan line 11 located in the first region P1 may be controlled to be similar to the load of the scan line 11 located in the second region P2. Therefore, it is possible to prevent or reduce instances of a luminance difference occurring in the first region P1 and the second region P2.

In the above, it has been described that a plurality of first load adjusting electrodes 52 are extended side by side and the second load adjusting electrode 53 has a total plate shape overlapping a plurality of load adjusting wires 51 and a plurality of first load adjusting electrodes 52, but it is not limited thereto. For example, a plurality of second load adjusting electrodes 53 may be extended side by side and the first load adjusting electrode 52 may have the total plate shape overlapping a plurality of load adjusting wires 51 and a plurality of second load adjusting electrodes 53.

Hereinafter, a connection relation of one pixel and each wire of the display device according to some example embodiments is described with reference to FIG. 6.

Figure 6:
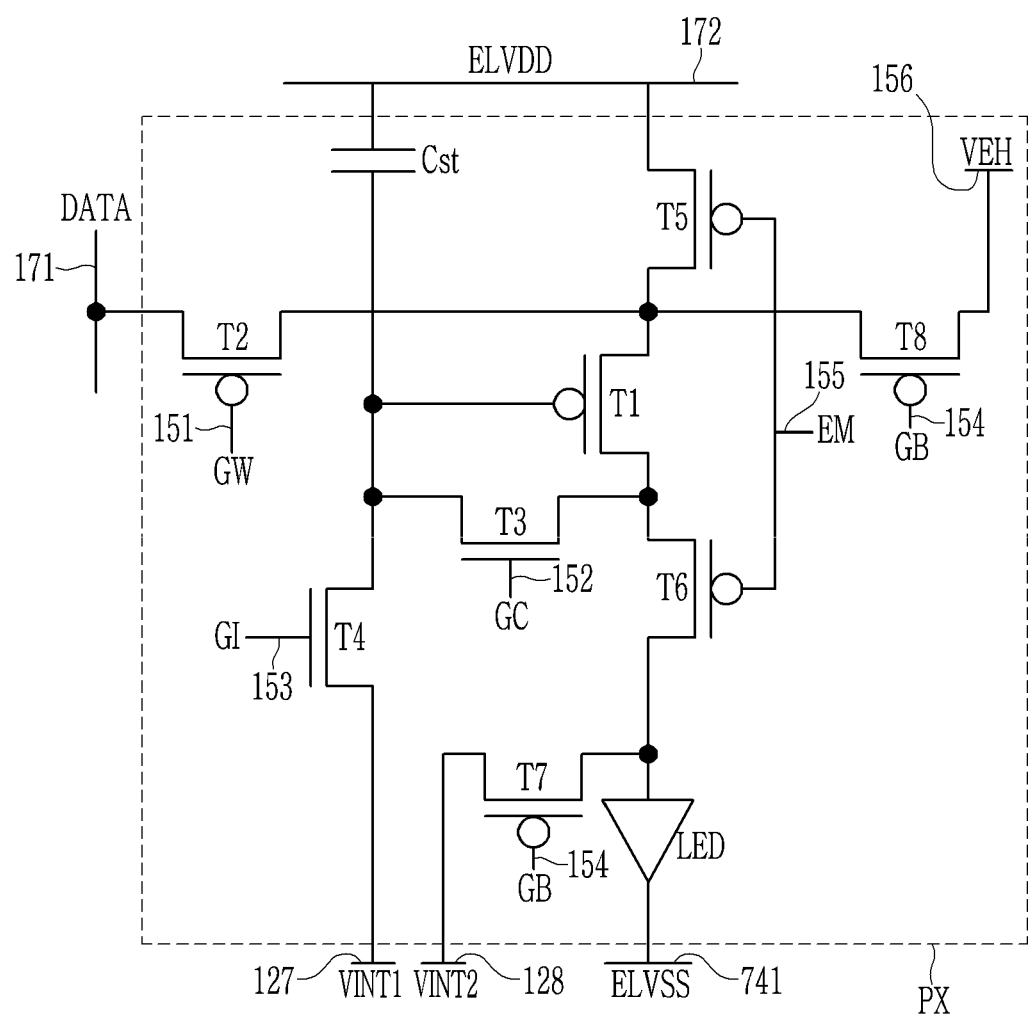
FIG. 6 is a circuit diagram of any one pixel of a display device according to some example embodiments.

FIG. 6 is a circuit diagram of one pixel of a display device according to some example embodiments.

As shown in FIG. 6, one pixel PX of the display device according to some example embodiments includes a plurality of transistors T1, T2, T3, T4, T5, T6, T7, and T8, a storage capacitor Cst, and a light emitting diode LED, which are connected to several signal lines.

A plurality of signal lines 127, 128, 151, 152, 153, 154, 155, 156, 171, 172, and 741 are connected to one pixel PX. A plurality of signal lines includes a first initialization voltage line 127, a second initialization voltage line 128, a first scan line 151, a second scan line 152, an initialization control line 153, a bypass control line 154, a light emission control line 155, a reference voltage line 156, a data line 171, a driving voltage line 172, and a common voltage line 741.

The first scan line 151 is connected to a gate driver to transmit a first scan signal GW to the second transistor T2. In the second scan line 152, the voltage of an opposite polarity to the voltage applied to the first scan line 151 may be applied at the same time as the signal of the first scan line 151. For example, when a high voltage is applied to the first scan line 151, a low voltage may be applied to the second scan line 152. The second scan line 152 transmits a second scan signal GC to the third transistor T3.

The initialization control line 153 transmits an initialization control signal GI to the fourth transistor T4. The bypass control line 154 transmits a bypass signal GB to the seventh transistor T7 and the eighth transistor. The bypass control line 154 may consist of the first scan line 151 at the next stage. The light emission control line 155 transmits a light emission control signal EM to the fifth transistor T5 and the sixth transistor T6.

The data line 171 is a wire transmitting a data voltage DATA generated from a data driver, and a luminance emitted by the light emitting diode (LED) LD is changed depending on the data voltage DATA applied to the pixel PX.

The driving voltage line 172 applies a driving voltage ELVDD, and the reference voltage line 156 applies a reference voltage VEH. The first initialization voltage line 127 transmits a first initialization voltage VINT1, and the second initialization voltage line 128 transmits a second initialization voltage VINT2. The common voltage line 741 applies a common voltage ELVSS to a cathode of the light emitting diode LED. According to some example embodiments, each voltage applied to the driving voltage line 172, the reference voltage line 156, the first and second initialization voltage lines 127 and 128, and the common voltage line 741 may be a constant voltage.

Hereinafter, the structure and connection relationship of a plurality of transistors is described in more detail.

The driving transistor T1 may have a p-type transistor characteristic and include a polycrystalline semiconductor. The driving transistor T1 may receive the data voltage DATA depending on a switching operation of the second transistor T2 to supply a driving current to an anode of the light emitting diode LED. Because the brightness of the light emitting diode LED is adjusted according to the magnitude of the driving current output to the anode of the light emitting diode LED, the luminance of the light emitting diode LED may be adjusted according to the data voltage DATA applied to the pixel PX. For this purpose, the first electrode of the driving transistor T1 is located to receive the driving voltage ELVDD and is connected to the driving voltage line 172 via the fifth transistor T5. Also, the first electrode of the driving transistor T1 is connected to the second electrode of the second transistor T2 to receive the data voltage DATA. On the other hand, the second electrode of the driving transistor T1 is located so as to output the current toward the light emitting diode LED and is connected to the anode of the light emitting diode LED via the sixth transistor T6. Also, the second electrode of the driving transistor T1 transmits the data voltage DATA applied to the first electrode to the third transistor T3. On the other hand, the gate electrode of the driving transistor T1 is connected to one electrode (hereinafter referred to as a second storage electrode) of the storage capacitor Cst. Accordingly, the voltage of the gate electrode of the driving transistor T1 changes according to the voltage stored in the storage capacitor Cst, and accordingly the driving current output by the driving transistor T1 changes. In addition, the storage capacitor Cst also serves to keep the voltage of the gate electrode of the driving transistor T1 constant for one frame.

The second transistor T2 may have a p-type transistor characteristic, and may include a polycrystalline semiconductor. The second transistor T2 is a transistor that accepts the data voltage DATA into the pixel PX. The gate electrode of the second transistor T2 is connected to the first scan line 151. The first electrode of the second transistor T2 is connected to the data line 171. The second electrode of the second transistor T2 is connected to the first electrode of the driving transistor T1. When the second transistor T2 is turned on by the low voltage among the first scan signal GW transmitted through the first scan line 151, the data voltage DATA transmitted through the data line 171 is transferred to the first electrode of the driving transistor T1.

The third transistor T3 may have an n-type transistor characteristic and may include an oxide semiconductor. The third transistor T3 is electrically connected to the second electrode of the driving transistor T1 and the gate electrode of the driving transistor T1. As a result, it is a transistor allowing a compensation voltage to which the data voltage DATA is changed through the driving transistor T1 to be transferred to the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst and the gate electrode of the driving transistor T1. The third transistor T3 is turned on by the high voltage among the second scan signal GC transmitted through the second scan line 152 to connect the gate electrode of the driving transistor T1 and the second electrode of the driving transistor T1 and to transmit the voltage applied to the gate electrode of the driving transistor T1 to the second storage electrode of the storage capacitor Cst to be stored in the storage capacitor Cst.

The fourth transistor T4 may have an n-type transistor characteristic and may include an oxide semiconductor. The fourth transistor T4 serves to initialize the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second storage electrode of the storage capacitor Cst and the gate electrode of the driving transistor T1 via the second electrode of the third transistor T3. The fourth transistor T4 is turned on by the high voltage among the initialization control signal GI transmitted through the initialization control line 153, and in this case, the first initialization voltage VINT1 is transmitted to the gate electrode of the driving transistor T1 and the second storage electrode of the storage capacitor Cst. Accordingly, the voltage of the gate electrode of the driving transistor T1 and the storage capacitor Cst are initialized.

The fifth transistor T5 may have a p-type transistor characteristic and may include a polycrystalline semiconductor. The fifth transistor T5 serves to transmit the driving voltage ELVDD to the driving transistor T1. The gate electrode of the fifth transistor T5 is connected to the light emission control line 155, the first electrode of the fifth transistor T5 is connected to the driving voltage line 172, and the second electrode of the fifth transistor T5 is connected to the first electrode of the driving transistor T1.

The sixth transistor T6 may have a p-type transistor characteristic and may include a polycrystalline semiconductor. The sixth transistor T6 serves to transfer the driving current output from the driving transistor T1 to the light emitting diode LED. The gate electrode of the sixth transistor T6 is connected to the light emission control line 155, the first electrode of the sixth transistor T6 is connected to the second electrode of the driving transistor T1, and the second electrode of the sixth transistor T6 is connected to the anode of the light emitting diode LED.

The seventh transistor T7 may have a p-type transistor characteristic and may include a polycrystalline semiconductor. The seventh transistor T7 serves to initialize the anode of the light emitting diode LED. The gate electrode of the seventh transistor T7 is connected to the bypass control line 154, the first electrode of the seventh transistor T7 is connected to the anode of the light emitting diode LED, and the second electrode of the seventh transistor T7 is connected to the second initialization voltage line 128. If the seventh transistor T7 is turned on by the low voltage among the bypass signal GB, and the second initialization voltage VINT2 is applied to the anode of the light emitting diode (LED) LD to be initialized.

The eighth transistor T8 may have a p-type transistor characteristic and may include a polycrystalline semiconductor. The gate electrode of the eighth transistor T8 is connected to the bypass control line 154, the first electrode of the eighth transistor T8 is connected to the reference voltage line 156, and the second electrode of the eighth transistor T8 is connected to the first electrode of the driving transistor T1. When the eighth transistor T8 is turned on by the low voltage among the the bypass signal GB, the reference voltage VEH is applied to the first electrode of the driving transistor T1.

In the above, one pixel is described as including eight transistors T1 to T8 and one storage capacitor Cst, but is not limited thereto, and the number of transistors, the number of capacitors, and the connection relationship between them may be variously changed.

According to some example embodiments, the driving transistor T1 may include a polycrystalline semiconductor. Also, the third transistor T3 and the fourth transistor T4 may include the oxide semiconductor. The second transistor T2, the fifth transistor T5, the sixth transistor T6, the seventh transistor T7, and the eighth transistor T8 may include the polycrystalline semiconductor. However, embodiments according to the present invention are not limited thereto, and at least any one of the second transistor T2, the fifth transistor T5, the sixth transistor T6, the seventh transistor T7, and the eighth transistor T8 may include an oxide semiconductor. According to some example embodiments, by making the third transistor T3 and the fourth transistor T4 include the different semiconductor material from the driving transistor T1, the driving may be performed more stably and reliability may be improved.

The scan line 11 connected to the load adjusting portion 50 in the display device according to some example embodiments may be the first scan line 151. However, the scan line 11 connected to the load adjusting portion 50 is not limited thereto and may be another signal line. For example, the scan line 11 connected to the load adjusting portion 50 may be the second scan line 152. As another example, a portion of the scan line 11 connected to the load adjusting portion 50 may be the first scan line 151 and another portion may be the second scan line 152.

The connection wiring portion 20 may be connected to a plurality of signal lines 12. For example, the connection wiring portion 20 may be connected to the light emission control line 155, the bypass control line 154, the initialization control line 153, and the second scan line 152. The connection wiring portion 20 may include a first connection wire 21, a second connection wire 22, a third connection wire 23, and a fourth connection wire 24. In this case, the first connection wire 21 may be connected to the light emission control line 155. The first connection wire 21 may connect the light emission control line 155 located at the left of the notch portion NP and the light emission control line 155 located at the right of the notch portion NP. The second connection wire 22 can be connected to the bypass control line 154. The second connection wire 22 may be connected to the bypass control line 154 located at the left of the notch portion NP and the bypass control line 154 located at the right of the notch portion NP. The third connection wire 23 may be connected to the initialization control line 153. The third connection wire 23 may connect the initialization control line 153 located at the left of the notch portion NP and the initialization control line 153 located at the right of the notch portion NP. The fourth connection wire 24 may be connected to the second scan line 152. The fourth connection wire 24 may connect the second scan line 152 located at the left of the notch portion NP and the second scan line 152 located at the right of the notch portion NP.

The connection relationship between the connection wiring portion 20 and the signal line 12 is only an example, and the connection relationship between them may be variously changed. For example, the first connection wire 21 may be connected to the bypass control line 154, and the second connection wire 22 may be connected to the light emission control line 155. The third connection wire 23 may be connected to the second scan line 152, and the fourth connection wire 24 may be connected to the initialization control line 153.

Hereinafter, the structure on a plane and a cross-sectional of the driving transistor T1, the third transistor T3, the fourth transistor T4, and the like are further described with reference to FIG. 7 to FIG. 14.

Figure 7:
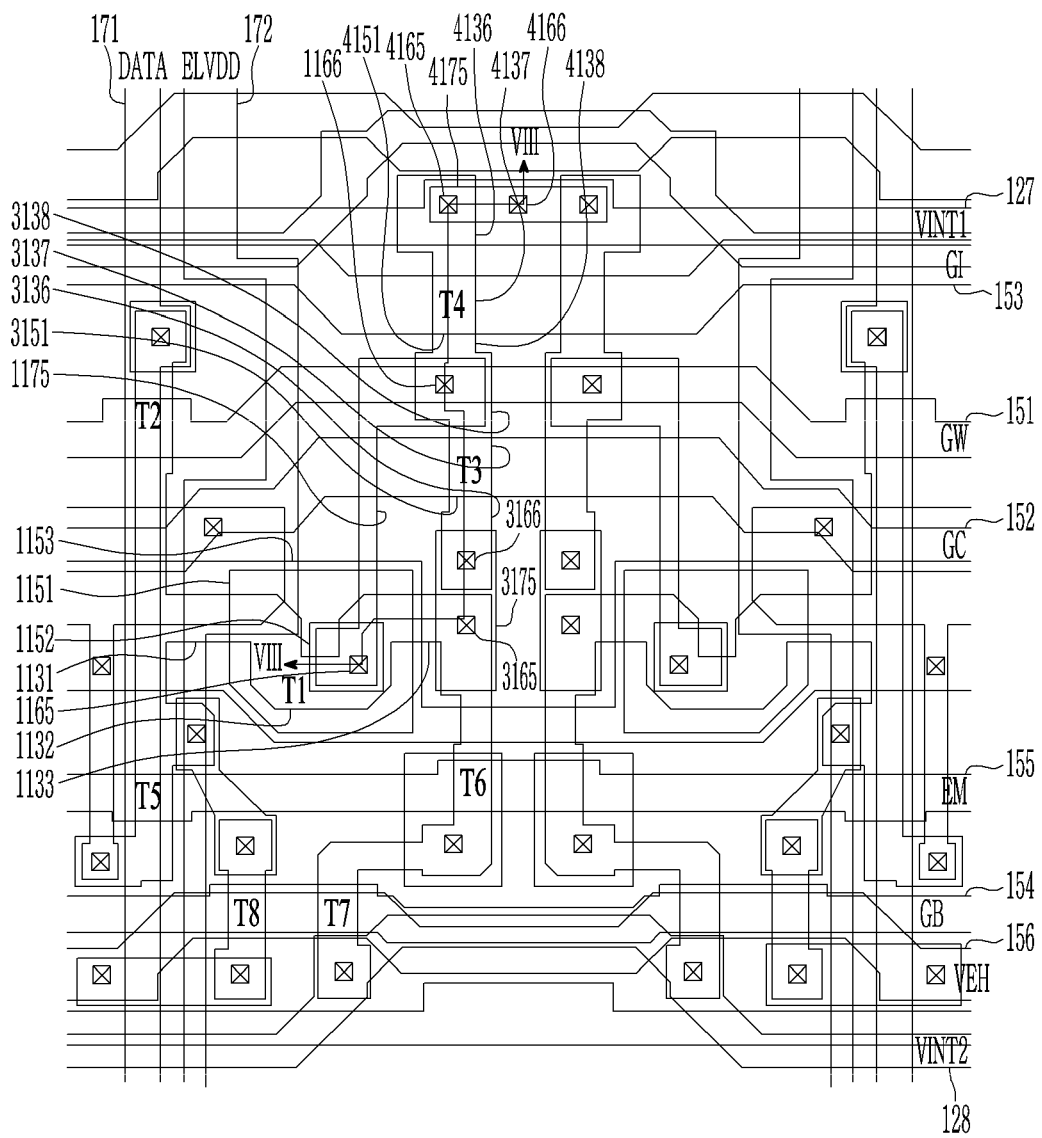
FIG. 7 is a top plan view showing a display device according to some example embodiments.
Figure 8:
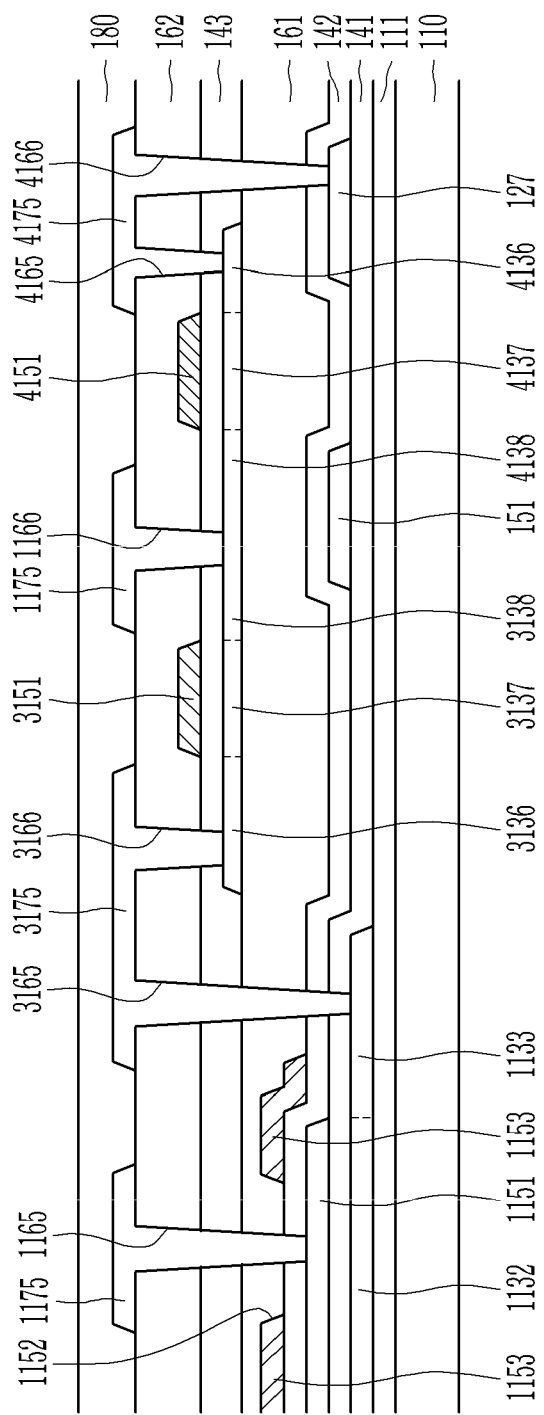
FIG. 8 is a cross-sectional view taken along a line VIII-VIII of FIG. 7.

FIG. 7 is a top plan view showing a display device according to some example embodiments, FIG. 8 is a cross-sectional view taken along a line VIII-VIII of FIG. 7, and FIG. 9 to FIG. 14 are top plan views sequentially showing a manufacturing sequence of a display device according to some example embodiments. FIG. 7 to FIG. 14 show two adjacent pixels, and the two pixels may be symmetrical to each other. Hereinafter, the pixel located at the left is mainly described.

Figure 9:
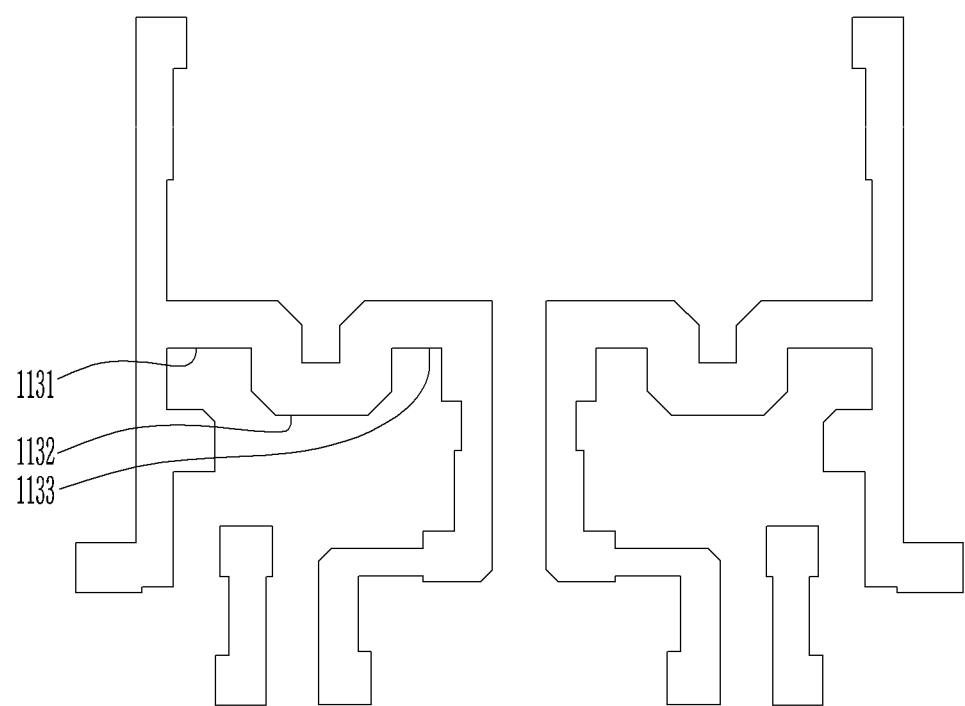
FIG. 9 to FIG. 14 are top plan views sequentially showing a manufacturing sequence of a display device according to some example embodiments.

As shown in FIG. 7 to FIG. 14, a channel 1132 of a driving transistor T1 and a polycrystalline semiconductor layer including a first electrode 1131 and a second electrode 1133 may be located on a substrate 110. FIG. 9 shows the polycrystalline semiconductor layer. The polycrystalline semiconductor layer may further include each channel, first electrode, and second electrode of the second transistor T2, the fifth transistor T5, the sixth transistor T6, the seventh transistor T7, and the eighth transistor T8 as well as the driving transistor T1.

The channel 1132 of the driving transistor T1 may be formed in a curved shape on a plane. However, the shape of the channel 1132 of the driving transistor T1 is not limited thereto and may be variously changed. For example, the channel 1132 of the driving transistor T1 may be bent in a different shape or may be formed in a rod shape. The first electrode 1131 and the second electrode 1133 of the driving transistor T1 may be located on both sides of the channel 1132 of the driving transistor T1. The first electrode 1131 of the driving transistor T1 extends up and down on a plane, so that the portion extending upward may be connected to the second electrode of the second transistor T2 and the portion extending downward may be connected to the second electrode of the fifth transistor T5. The second electrode 1133 of the driving transistor T1 extends down on a plane and may be connected to the first electrode of the sixth transistor T6.

A buffer layer 111 may be located between the substrate 110 and the polycrystalline semiconductor layer including the channel 1132, the first electrode 1131, and the second electrode 1133 of the driving transistor T1.

A first gate insulating layer 141 may be located on the polycrystalline semiconductor layer including the channel 1132, the first electrode 1131, and the second electrode 1133 of the driving transistor T1.

Figure 10:
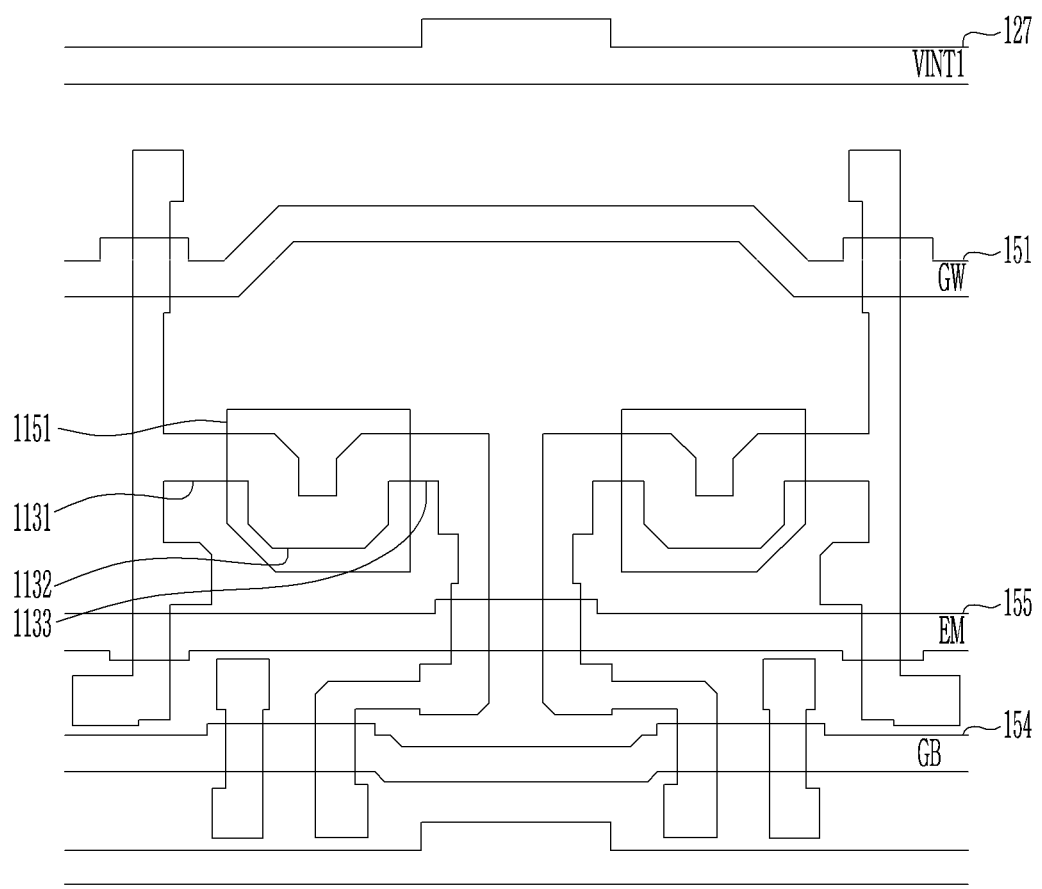

A first gate conductive layer including a gate electrode 1151 of the driving transistor T1 may be located on the first gate insulating layer 141. FIG. 10 shows the polycrystalline semiconductor layer and the first gate conductive layer together.

The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may include a first initialization voltage line 127, a first scan line 151, a light emission control line 155, and a bypass control line 154. The first initialization voltage line 127, the first scan line 151, the light emission control line 155, and the bypass control line 154 may be extended in an approximately horizontal direction. The first initialization voltage line 127 may be connected to the first electrode of the fourth transistor T4. The first scan line 151 may be connected to the gate electrode of the second transistor T2. The gate electrode of the fifth transistor T5 and the gate electrode of the sixth transistor T6 may be connected to the light emission control line 155. The gate electrode of the seventh transistor T7 and the gate electrode of the eighth transistor T8 may be connected to the bypass control line 154.

As described above, the first connection wire 21 may be located on the first gate conductive layer. Therefore, the first connection wire 21 may be located on the same layer as the gate electrode 1151 of the driving transistor T1. The first connection wire 21 may be located on the same layer as the first initialization voltage line 127, the first scan line 151, the light emission control line 155, and the bypass control line 154.

After forming the first gate conductive layer including the gate electrode 1151 of the driving transistor T1, a doping process may be performed. The polycrystalline semiconductor layer covered by the first gate conductive layer is not doped, and the part of the polycrystalline semiconductor layer that is not covered by the first gate conductive layer is doped, thereby having the same characteristic as the conductor. At this time, a doping process may be performed with a p-type dopant, and the driving transistor T1, the second transistor T2, the fifth transistor T5, the sixth transistor T6, the seventh transistor T7, and the eighth transistor T8 including the polycrystalline semiconductor may have the p-type transistor characteristic.

A second gate insulating layer 142 may be located on the first gate conductive layer including the gate electrode 1151 of the driving transistor T1 and the first gate insulating layer 141.

Figure 11:
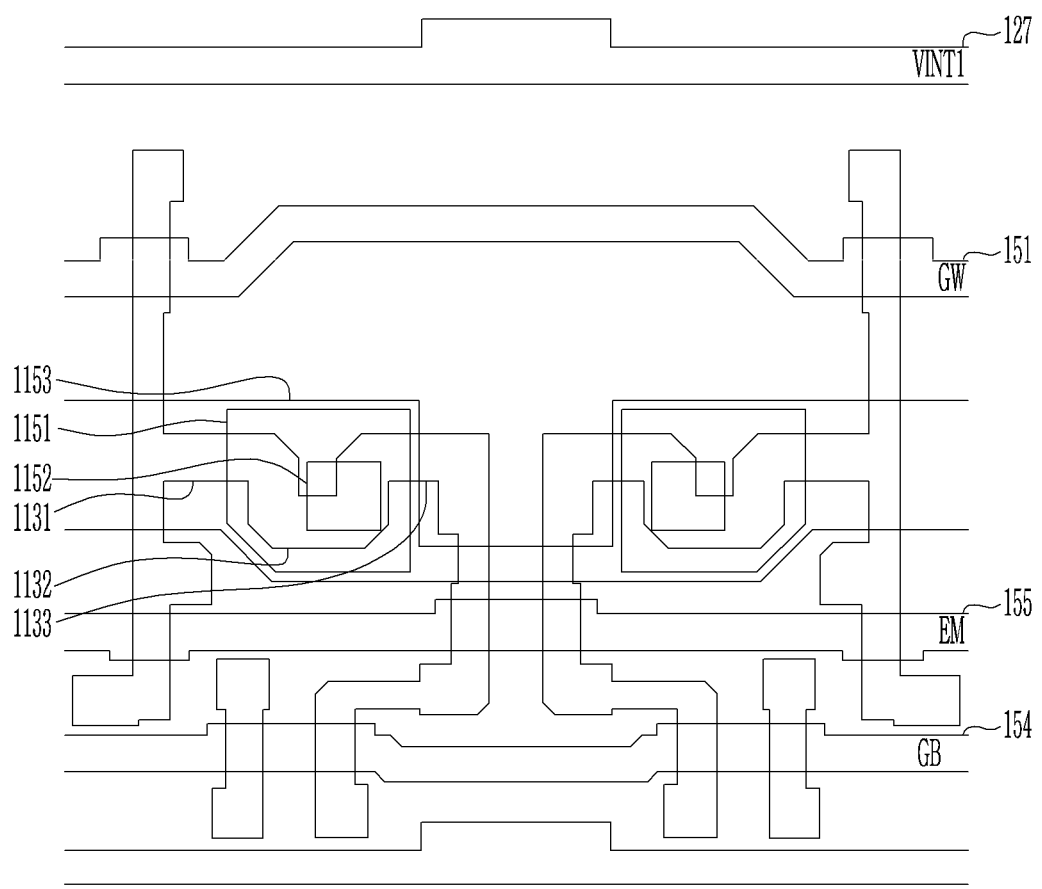

On the second gate insulating layer 142, a second gate conductive layer including a first storage electrode 1153 of a storage capacitor Cst may be located. FIG. 11 shows the polycrystalline semiconductor layer, the first gate conductive layer, and the second gate conductive layer together.

The first storage electrode 1153 overlaps the gate electrode 1151 of the driving transistor T1, thereby forming the storage capacitor Cst. The first storage electrode 1153 of the storage capacitor Cst has an opening 1152. The opening 1152 of the first storage electrode 1153 of the storage capacitor Cst may overlap the gate electrode 1151 of the driving transistor T1.

As described above, the second connection wire 22 and the first load adjusting electrode 52 may be located on the second gate conductive layer. Therefore, the second connection wire 22 and the first load adjusting electrode 52 may be located on the same layer as the first storage electrode 1153 of the storage capacitor Cst.

A first interlayer insulating layer 161 may be located on the second gate conductive layer including the first storage electrode 1153 of the storage capacitor Cst.

Figure 12:
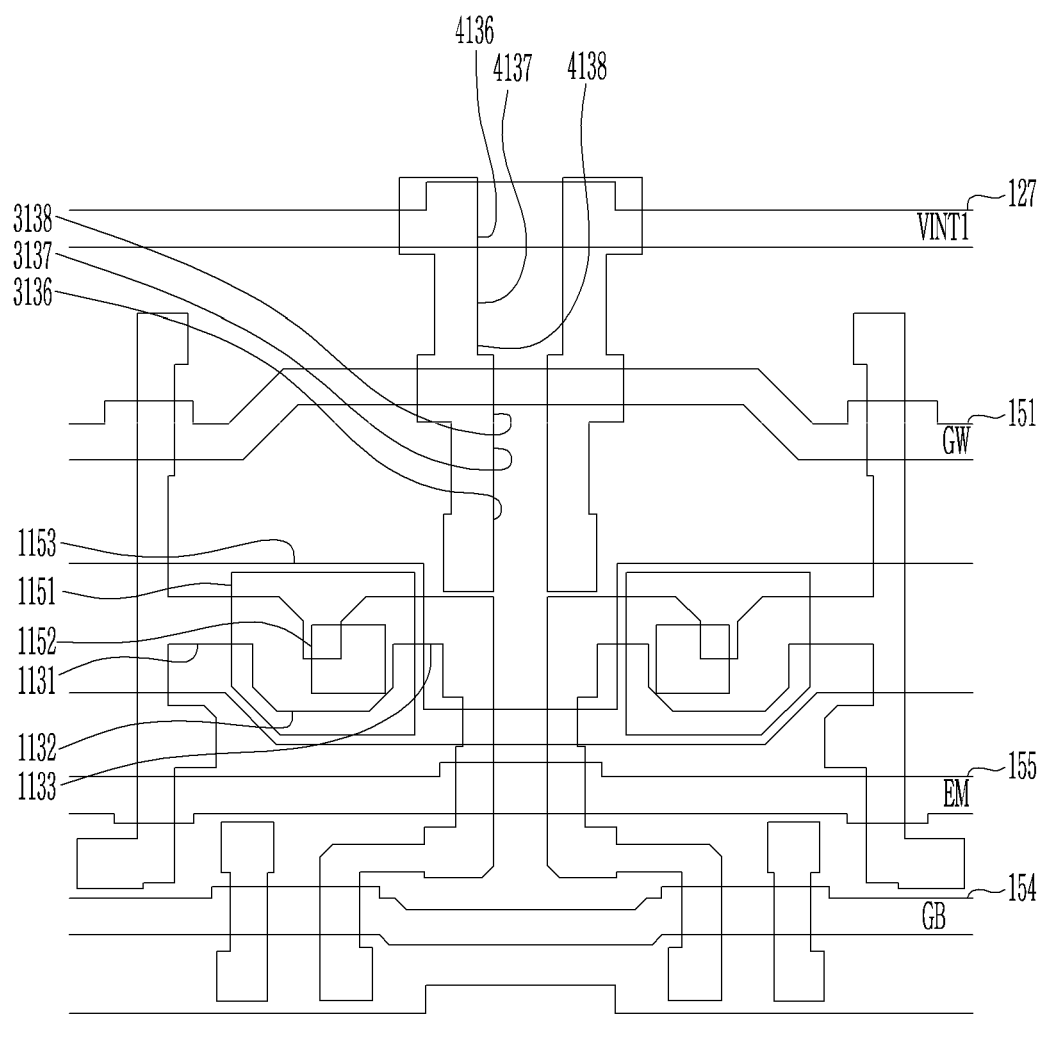

On the first interlayer insulating layer 161, an oxide semiconductor layer including a channel 3137, a first electrode 3136, and a second electrode 3138 of a third transistor T3, and a channel 4137, a first electrode 4136, and a second electrode 4138 of the fourth transistor T4 may be located. FIG. 12 shows the polycrystalline semiconductor layer, the first gate conductive layer, the second gate conductive layer, and the oxide semiconductor layer together.

The channel 3137, the first electrode 3136, and the second electrode 3138 of the third transistor T3, and the channel 4137, the first electrode 4136, and the second electrode 4138 of the fourth transistor T4 may be connected to each other to be integrally formed. The first electrode 3136 and the second electrode 3138 of the third transistor T3 may be located on both sides of the channel 3137 of the third transistor T3. The first electrode 4136 and the second electrode 4138 of the fourth transistor T4 may be located on both sides of the channel 4137 of the fourth transistor T4. The second electrode 3138 of the third transistor T3 may be connected to the second electrode 4138 of the fourth transistor T4.

A third gate insulating layer 143 may be located on the oxide semiconductor layer including the channel 3137, the first electrode 3136, and the second electrode 3138 of the third transistor T3, and the channel 4137, the first electrode 4136, and the second electrode 4138 of the fourth transistor T4. The third gate insulating layer 143 may be located in the entire surface of the oxide semiconductor layer and the first interlayer insulating layer 161. Accordingly, the third gate insulating layer 143 may cover the upper surface and the side surface of the channel 3137, the first electrode 3136, and the second electrode 3138 of the third transistor T3, and the channel 4137, the first electrode 4136, and the second electrode 4138 of the fourth transistor T4. However, embodiments according to the present disclosure are not limited thereto, and the third gate insulating layer 143 may not be located in the entire surface of the oxide semiconductor layer and the first interlayer insulating layer 161. For example, the third gate insulating layer 143 may overlap the channel 3137 of the third transistor T3 and may not overlap the first electrode 3136 and the second electrode 3138. Also, the third gate insulating layer 143 may overlap the channel 4137 of the fourth transistor T4 and may not overlap the first electrode 4136 and the second electrode 4138.

Figure 13:
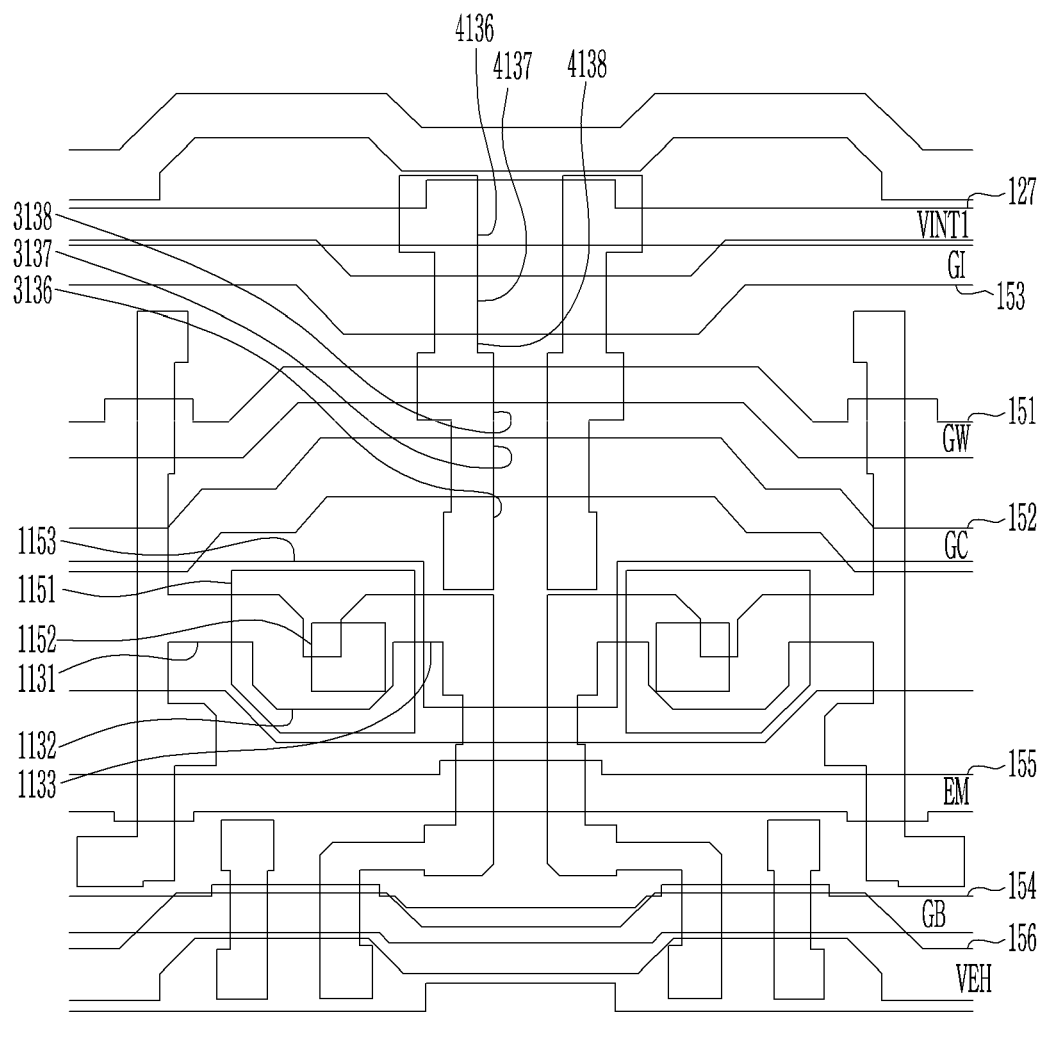

A third gate conductive layer including a gate electrode 3151 of the third transistor T3 and a gate electrode 4151 of the fourth transistor T4 may be located on the third gate insulating layer 143. FIG. 13 shows the polycrystalline semiconductor layer, the first gate conductive layer, the second gate conductive layer, the oxide semiconductor layer, and the third gate conductive layer together.

The gate electrode 3151 of the third transistor T3 may overlap the channel 3137 of the third transistor T3. The gate electrode 4151 of the fourth transistor T4 may overlap the channel 4137 of the fourth transistor T4.

The third gate conductive layer may further include an initialization control line 153, a second scan line 152, and a reference voltage line 156. The initialization control line 153, the second scan line 152, and the reference voltage line 156 may be extended in an approximately horizontal direction. The initialization control line 153 may be connected to the gate electrode 4151 of the fourth transistor T4. The second scan line 152 may be connected to the gate electrode 3151 of the third transistor T3. The reference voltage line 156 may be connected to the first electrode of the eighth transistor T8.

As described above, the load adjusting wiring 51 and the load connection wiring 55 may be located on the third gate conductive layer. Therefore, the load adjusting wiring 51 and the load connection wiring 55 may be located on the same layer as the gate electrode 3151 of the third transistor T3 and the gate electrode 4151 of the fourth transistor T4. The load adjusting wiring 51 and the load connection wiring 55 may be located on the same layer as the initialization control line 153, the second scan line 152, and the reference voltage line 156.

After forming the third gate conductive layer including the gate electrode 3151 of the third transistor T3 and the gate electrode 4151 of the fourth transistor T4, a doping process may be performed. The portion of the oxide semiconductor layer covered by the third gate conductive layer is not doped, and the portion of the oxide semiconductor layer that is not covered by the third gate conductive layer is doped, thereby having the same characteristic as the conductor. The channel 3137 of the third transistor T3 may be located below the gate electrode 3151 to overlap the gate electrode 3151. The first electrode 3136 and the second electrode 3138 of the third transistor T3 may not overlap with the gate electrode 3151. The channel 4137 of the fourth transistor T4 may be located below the gate electrode 4151 to overlap the gate electrode 4151. The first electrode 4136 and the second electrode 4138 of the fourth transistor T4 may not overlap with the gate electrode 4151. The doping process of the oxide semiconductor layer may be performed with an n-type dopant, and the third transistor T3 and the fourth transistor T4 including the oxide semiconductor layer may have an n-type transistor characteristic.

A second interlayer insulating layer 162 may be located on the third gate conductive layer including the gate electrode 3151 of the third transistor T3 and the gate electrode 4151 of the fourth transistor T4. The second interlayer insulating layer 162 may have a first opening 1165, a second opening 1166, a third opening 3165, a fourth opening 3166, a fifth opening 4165, and a sixth opening 4166.

The first opening 1165 may overlap at least part of the gate electrode 1151 of the driving transistor T1. The first opening 1165 may be further formed in the third gate insulating layer 143, the first interlayer insulating layer 161, and second gate insulating layer 142. The first opening 1165 may overlap the opening 1152 of the first storage electrode 1153. The first opening 1165 may be located inside the opening 1152 of the first storage electrode 1153. The second opening 1166 may overlap at least a portion of the second electrode 3138 of the third transistor T3. The second opening 1166 may be further formed in the third gate insulating layer 143.

The third opening 3165 may overlap at least a portion of the second electrode 1133 of the driving transistor T1. The third opening 3165 may be further formed in the third gate insulating layer 143, the first interlayer insulating layer 161, the second gate insulating layer 142, and the first gate insulating layer 141. The fourth opening 3166 may overlap at least a portion of the first electrode 3136 of the third transistor T3. The fourth opening 3166 may be further formed in the third gate insulating layer 143.

The fifth opening 4165 may overlap at least a portion of the first electrode 4136 of the fourth transistor T4. The fifth opening 4165 may be further formed in the third gate insulating layer 143. The sixth opening 4166 may overlap at least a portion of the first initialization voltage line 127. The sixth opening 4166 may be further formed in the third gate insulating layer 143, the first interlayer insulating layer 161, and the second gate insulating layer 142.

Figure 14:
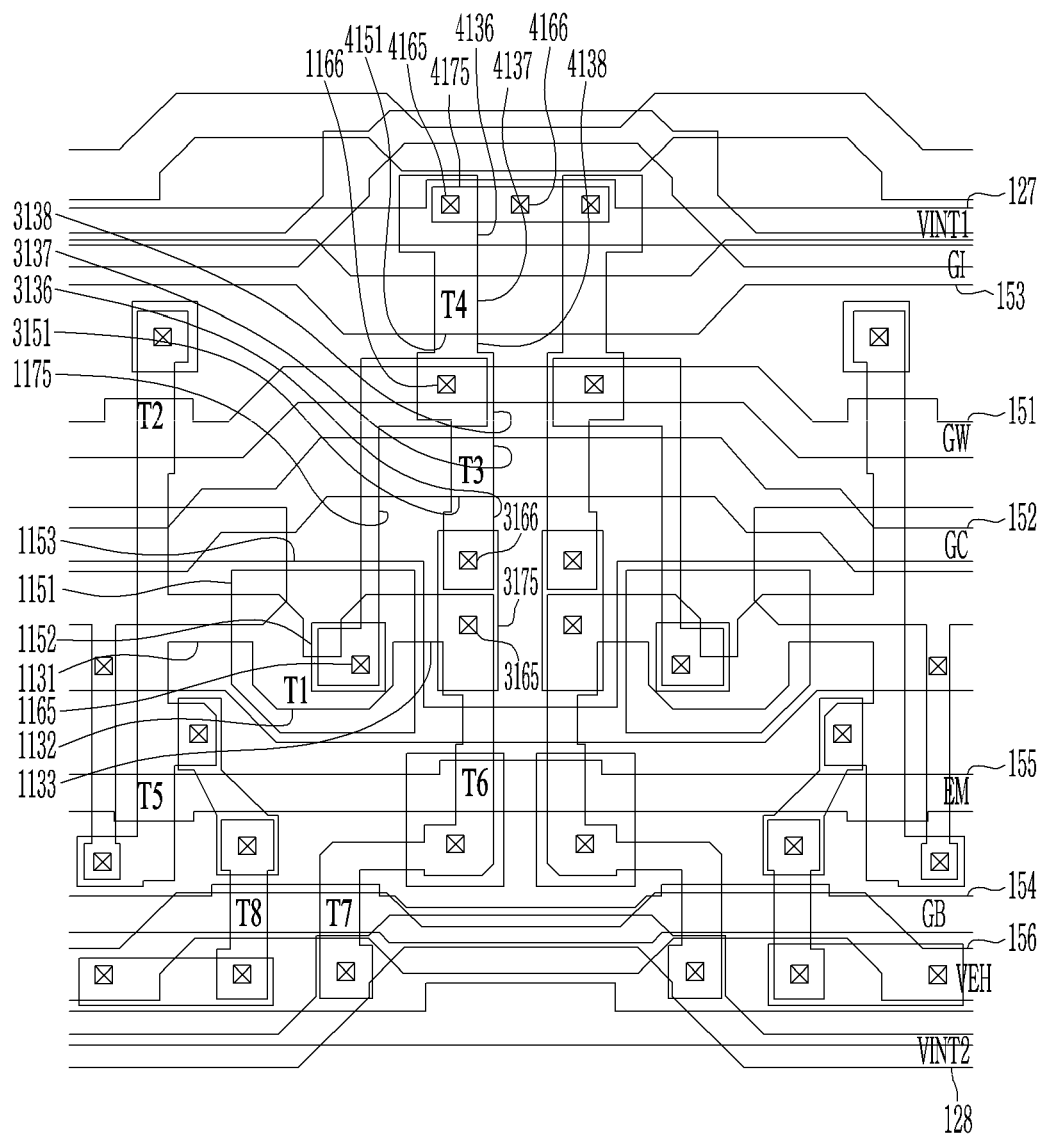

On the second interlayer insulating layer 162, a first data conductive layer including the first connection electrode 1175, the second connection electrode 3175, and the third connection electrode 4175 may be located. FIG. 14 shows the polycrystalline semiconductor layer, the first gate conductive layer, the second gate conductive layer, the oxide semiconductor layer, the third gate conductive layer, and the first data conductive layer together.

The first connection electrode 1175 may overlap the gate electrode 1151 of the driving transistor T1. The first connection electrode 1175 may be connected to the gate electrode 1151 of the driving transistor T1 through the first opening 1165 and the opening 1152 of the first storage electrode 1153. The first connection electrode 1175 may overlap the second electrode 3138 of the third transistor T3. The first connection electrode 1175 may be connected to the second electrode 3138 of the third transistor T3. Therefore, the gate electrode 1151 of the driving transistor T1 and the second electrode 3138 of the third transistor T3 may be connected by the first connection electrode 1175.

The second connection electrode 3175 may overlap the second electrode 1133 of the driving transistor T1. The second connection electrode 3175 may be connected to the second electrode 1133 of the driving transistor T1 through the third opening 3165. The second connection electrode 3175 may overlap the first electrode 3136 of the third transistor T3. The second connection electrode 3175 may be connected to the first electrode 3136 of the third transistor T3 through the fourth opening 3166. Accordingly, the second electrode 1133 of the driving transistor T1 and the first electrode 3136 of the third transistor T3 may be connected by the second connection electrode 3175.

The third connection electrode 4175 may overlap the first electrode 4136 of the fourth transistor T4. The third connection electrode 4175 may be connected to the first electrode 4136 of the fourth transistor T4 through the fifth opening 4165. The third connection electrode 4175 may overlap the first initialization voltage line 127. The third connection electrode 4175 may be connected to the first initialization voltage line 127 through the sixth opening 4166. Therefore, the first electrode 4136 of the fourth transistor T4 and the first initialization voltage line 127 may be connected by the third connection electrode 4175.

The first data conductive layer may further include a second initialization voltage line 128. The second initialization voltage line 128 may extend in an approximately horizontal direction. The second initialization voltage line 128 may be connected to the second electrode of the seventh transistor T7.

As described above, the third connection wire 23 and the second load adjusting electrode 53 may be located on the first data conductive layer. Therefore, the third connection wire 23 and the second load adjusting electrode 53 may be located on the same layer as the first connection electrode 1175, the second connection electrode 3175, and the third connection electrode 4175. The third connection wire 23 and the second load adjusting electrode 53 may be located on the same layer as the second initialization voltage line 128.

A third interlayer insulating layer 180 may be located on the first data conductive layer including the first connection electrode 1175, the second connection electrode 3175, and the third connection electrode 4175.

A second data conductive layer including a data line 171 and a driving voltage line 172 may be located on the third interlayer insulating layer 180. The data line 171 and the driving voltage line 172 may extend approximately in the vertical direction. The data line 171 may be connected to the second transistor T2. The data line 171 may be connected to the first electrode of the second transistor T2. The driving voltage line 172 may be connected to the fifth transistor T5. The driving voltage line 172 may be connected to the first electrode of the fifth transistor T5. The driving voltage line 172 may be connected to the storage capacitor Cst. The driving voltage line 172 may be connected to the first storage electrode 1153 of the storage capacitor Cst. The first storage electrodes 1153 of the storage capacitors Cst of the adjacent pixels are connected to each other and may extend in a substantially horizontal direction.

As described above, the fourth connection wire 24 may be located on the second data conductive layer. Accordingly, the fourth connection wire 24 may be located on the same layer as the data line 171 and the driving voltage line 172.

According to some example embodiments, a passivation layer may be located on the second data conductive layer including the data line 171 and the driving voltage line 172, and the anode may be located on the passivation layer. The anode may be connected to the sixth transistor T6 and may receive the output current of the driving transistor T1. A partition may be located on the anode. The partition includes an opening, and the opening of the partition may overlap the anode. A light-emitting element layer may be located in the opening of the partition. The cathode may be located on the light-emitting element layer and the partition. The anode, the light-emitting element layer, and the cathode may form the light emitting diode LED.

As described above, in the display device according to some example embodiments, the driving transistor T1 may include the polycrystalline semiconductor, and the third transistor T3 and the fourth transistor T4 may include the oxide semiconductor. As described above, as the third transistor T3 and the fourth transistor T4 include the different semiconductor material from the driving transistor T1, they may be driven more stably and the reliability may be improved.

In the above, the positions of the transistors included in one pixel and the wiring connected thereto on a plane and a cross-section are described, but they are not limited thereto. The positions on a plane and a cross-section of each constituent element may be changed in various ways.

Hereinafter, an example variation of the display device according to some example embodiments of FIG. 1 to FIG. 6 described above is described with reference to FIG. 15 to FIG. 17.

Figure 15:
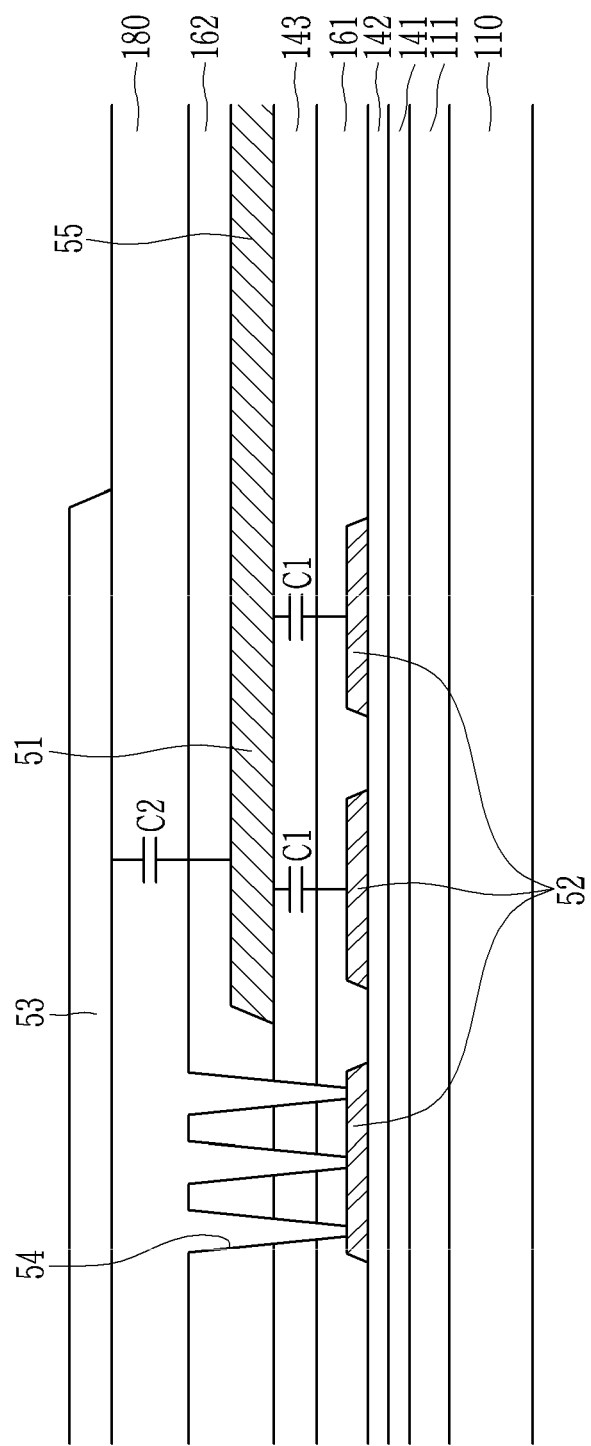
FIG. 15 to FIG. 17 are cross-sectional views showing a partial region of a display device according to some example embodiments.
Figure 16:
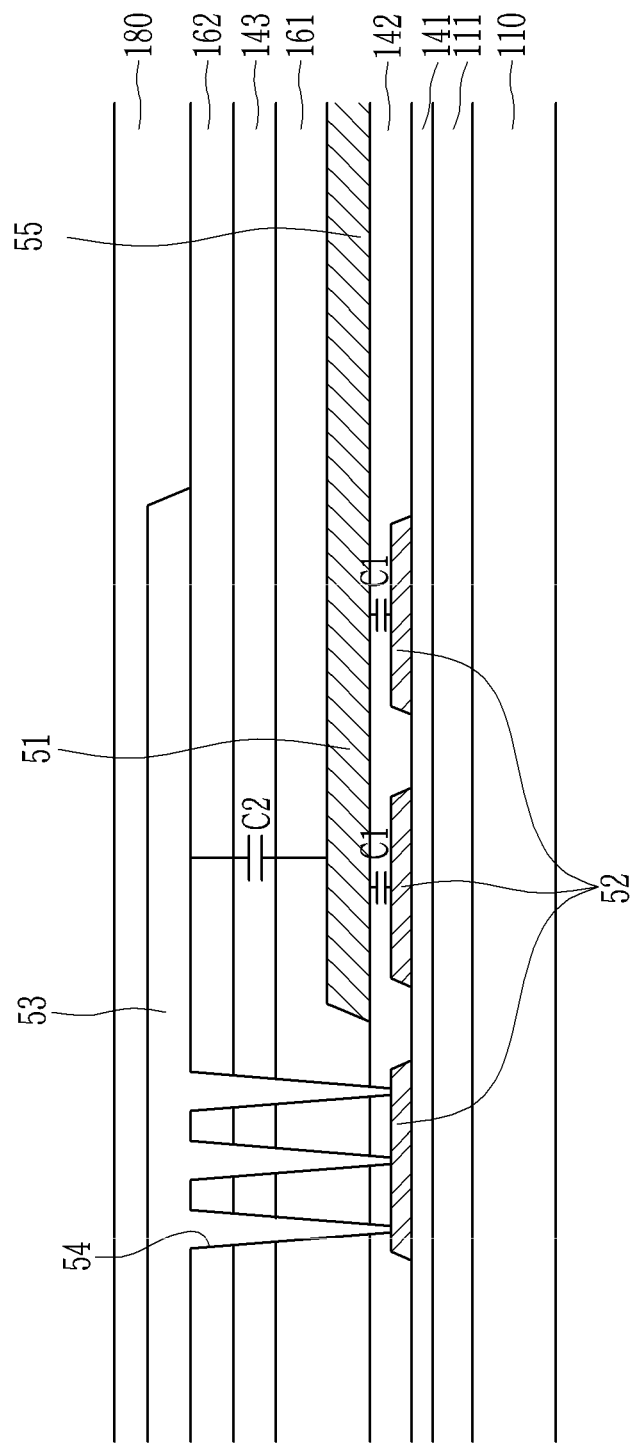
Figure 17:
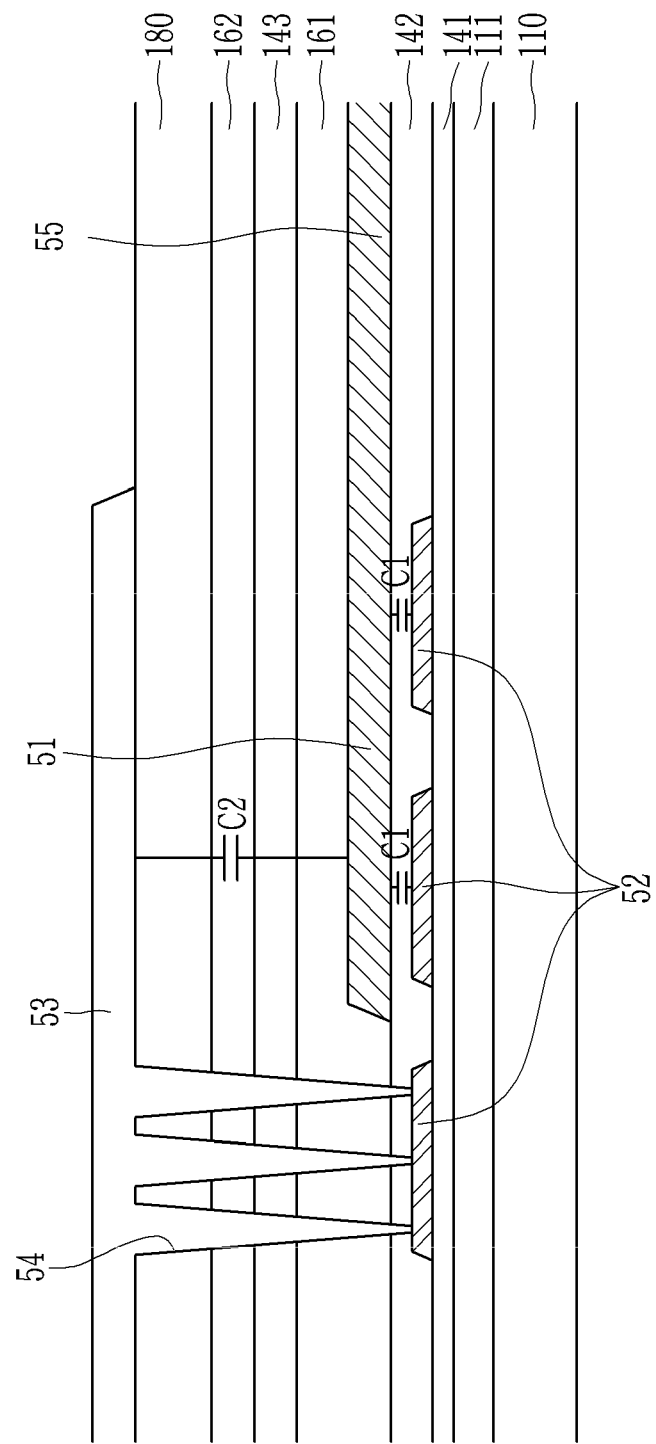

FIG. 15 to FIG. 17 are cross-sectional views showing some regions of a display device according to some example embodiments. FIG. 15 to FIG. 17 show numerous example variations of a cross-sectional shape of the load adjusting portion of the display device according to some example embodiments shown in FIG. 5.

The load adjusting portion 50 of the display device according to some example embodiments shown in FIG. 5 includes a load adjusting wiring 51 located in the third gate conductive layer, a first load adjusting electrode 52 located in the second gate conductive layer, and a second load adjusting electrode 53 located in the first data conductive layer. The layers in which the load adjusting wiring 51, the first load adjusting electrode 52 and the second load adjusting electrode 53 of the load adjusting portion 50 of the display device according to some example embodiments may be variously changed, and an example is described below.

As shown in FIG. 15, the load adjusting portion 50 of the display device according to some example embodiments may include the load adjusting wiring 51 located in the third gate conductive layer, the first load adjusting electrode 52 located in the second gate conductive layer, and the second load adjusting electrode 53 located in the second data conductive layer.

An insulating layer may be located between the second load adjusting electrode 53 and the load adjusting wiring 51. For example, a second interlayer insulating layer 162 and a third interlayer insulating layer 180 may be located between the second load adjusting electrode 53 and the load adjusting wiring 51.

An insulating layer may be located between the first load adjusting electrode 52 and the second load adjusting electrode 53. For example, a first interlayer insulating layer 161, a third gate insulating layer 143, a second interlayer insulating layer 162, and a third interlayer insulating layer 180 may be located between the first load adjusting electrode 52 and the second load adjusting electrode 53. The insulating layer located between the first load adjusting electrode 52 and the second load adjusting electrode 53 may include an opening 54. The opening 54 may be formed in the first interlayer insulating layer 161, the third gate insulating layer 143, the second interlayer insulating layer 162, and the third interlayer insulating layer 180. The opening 54 does not overlap the load adjusting wiring 51. The second load adjusting electrode 53 may be located within the opening 54. The second load adjusting electrode 53 may be connected to the first load adjusting electrode 52 through the opening 54.

According to some example embodiments, as shown in FIG. 16, the load adjusting portion 50 of the display device according to some example embodiments may include the load adjusting wiring 51 located in the second gate conductive layer, the first load adjusting electrode 52 located in the first gate conductive layer, and the second load adjusting electrode 53 located in the first data conductive layer.

The insulating layer may be located between the first load adjusting electrode 52 and the load adjusting wiring 51. For example, the second gate insulating layer 142 may be located between the first load adjusting electrode 52 and the load adjusting wiring 51.

The insulating layer may be located between the second load adjusting electrode 53 and the load adjusting wiring 51. For example, the first interlayer insulating layer 161, the third gate insulating layer 143, and the second interlayer insulating layer 162 may be located between the second load adjusting electrode 53 and the load adjusting wiring 51.

The insulating layer may be located between the first load adjusting electrode 52 and the second load adjusting electrode 53. For example, the second gate insulating layer 142, the first interlayer insulating layer 161, the third gate insulating layer 143, and the second interlayer insulating layer 162 may be located between the first load adjusting electrode 52 and the second load adjusting electrode 53. The insulating layer located between the first load adjusting electrode 52 and the second load adjusting electrode 53 may include an opening 54. The opening 54 may be located in the second gate insulating layer 142, the first interlayer insulating layer 161, the third gate insulating layer 143, and the second interlayer insulating layer 162. The opening 54 does not overlap the load adjusting wiring 51. The second load adjusting electrode 53 may be located within the opening 54. The second load adjusting electrode 53 may be connected to the first load adjusting electrode 52 through the opening 54.

According to some example embodiments, as shown in FIG. 17, the load adjusting portion 50 of the display device may include the load adjusting wiring 51 located in the second gate conductive layer, the first load adjusting electrode 52 located in the first gate conductive layer, and the second load adjusting electrode 53 located in the second data conductive layer.

The insulating layer may be located between the first load adjusting electrode 52 and the load adjusting wiring 51. For example, the second gate insulating layer 142 may be located between the first load adjusting electrode 52 and the load adjusting wiring 51.

The insulating layer may be located between the second load adjusting electrode 53 and the load adjusting wiring 51. For example, the first interlayer insulating layer 161, the third gate insulating layer 143, the second interlayer insulating layer 162, and the third interlayer insulating layer 180 may be located between the second load adjusting electrode 53 and the load adjusting wiring 51.

The insulating layer may be located between the first load adjusting electrode 52 and the second load adjusting electrode 53. For example, the second gate insulating layer 142, the first interlayer insulating layer 161, the third gate insulating layer 143, the second interlayer insulating layer 162, and the third interlayer insulating layer 180 may be located between the first load adjusting electrode 52 and the second load adjusting electrode 53. The insulating layer located between the first load adjusting electrode 52 and the second load adjusting electrode 53 may include the opening 54. The opening 54 may be formed in the second gate insulating layer 142, the first interlayer insulating layer 161, the third gate insulating layer 143, the second interlayer insulating layer 162, and the third interlayer insulating layer 180. The opening 54 does not overlap the load adjusting wiring 51. The second load adjusting electrode 53 may be located within the opening 54. The second load adjusting electrode 53 may be connected to the first load adjusting electrode 52 through the opening 54.

Next, the display device according to some example embodiments is described with reference to FIG. 18 to FIG. 21.

The display device according to some example embodiments, as shown in FIG. 18 to FIG. 21, is the same as most of the display device according to the example embodiment shown in FIG. 1 to FIG. 6 such that the description for the same portions is omitted. According to some example embodiments, the connection relationship of the load connection wiring and the load adjusting portion, the position relationship of the load connection wiring and the connection wiring portion, the position of each connection wire included in the connection wiring portion, and the like are different from those of the previous example embodiment.

Figure 18:
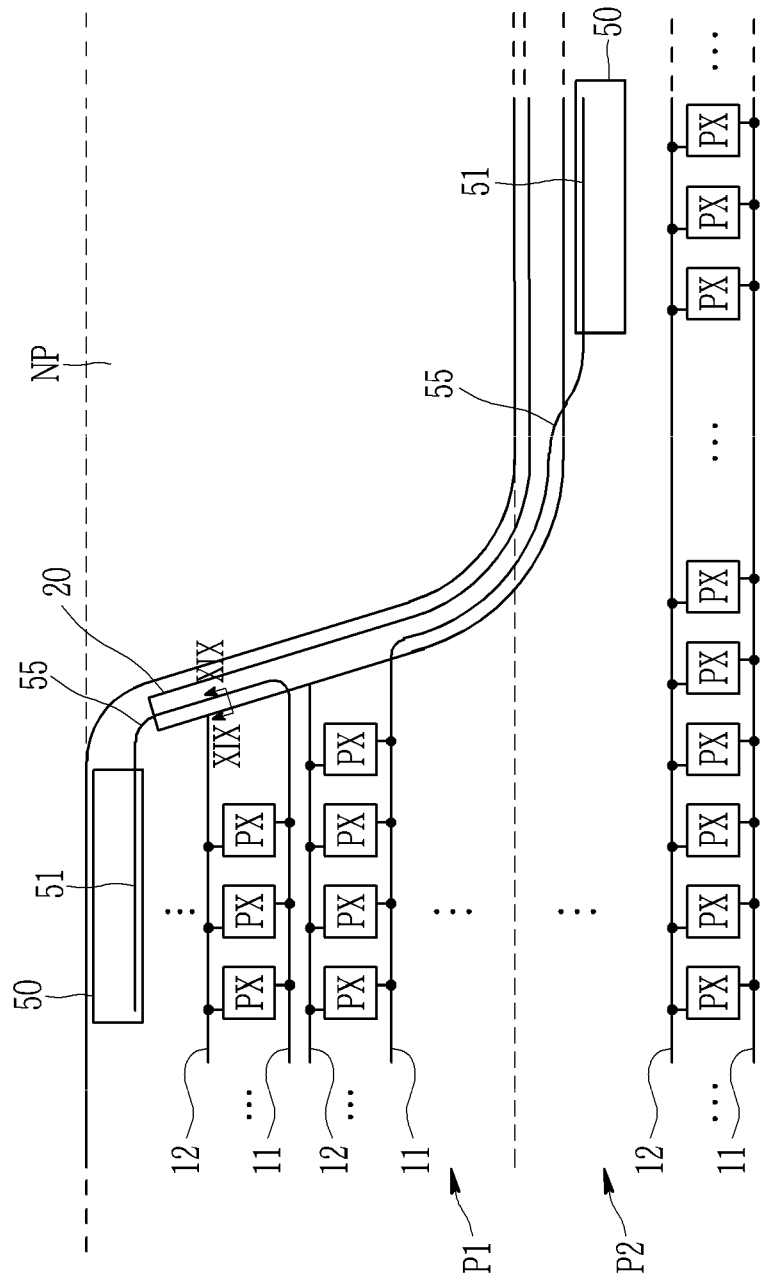
FIG. 18 is a top plan view showing a partial region of a display device according to some example embodiments.
Figure 19:
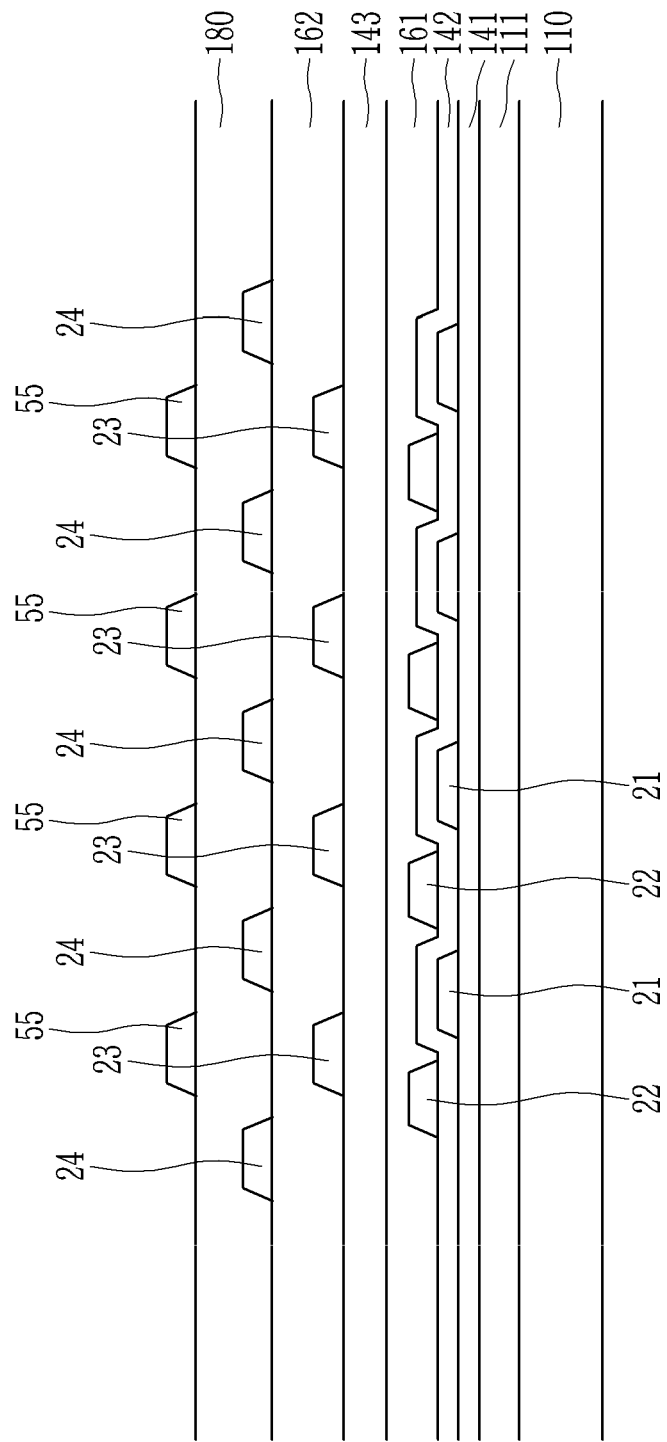
FIG. 19 is a cross-sectional view taken along a line XIX-XIX of FIG. 18.
Figure 20:
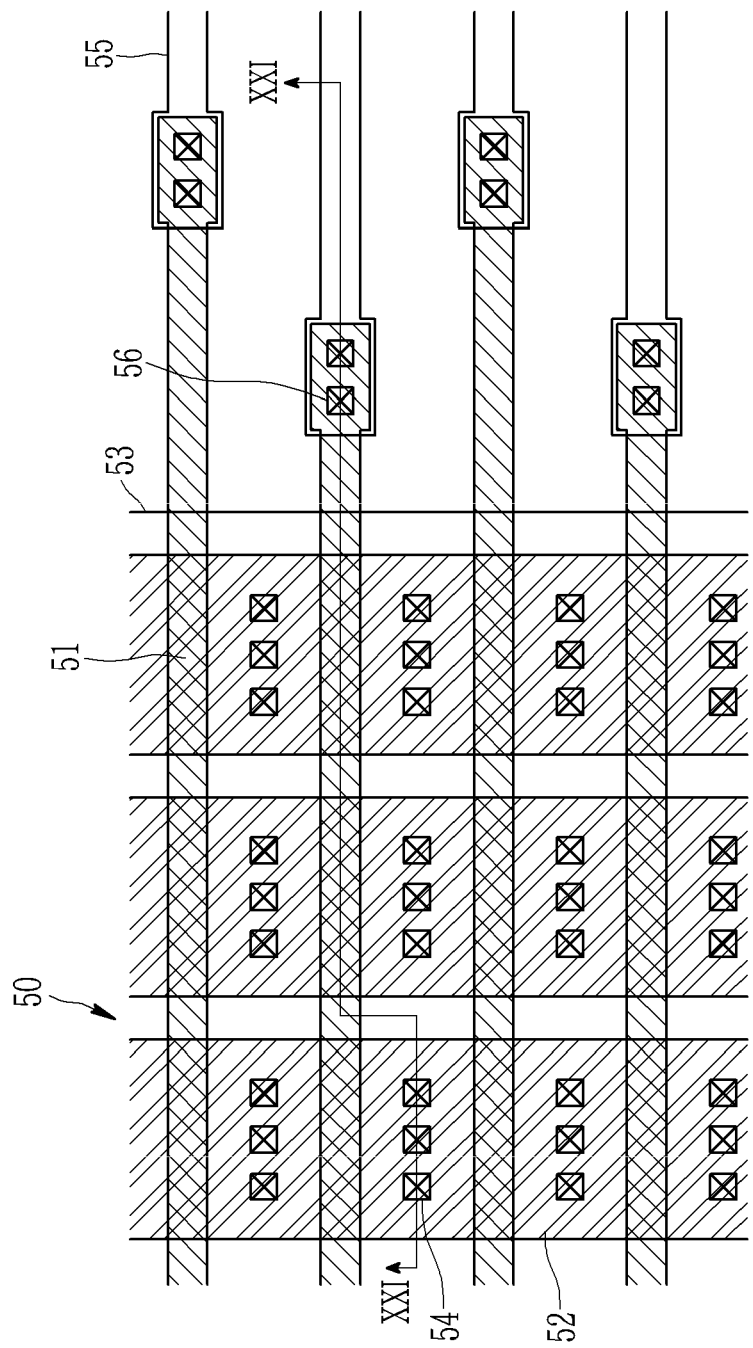
FIG. 20 is a top plan view showing a partial region of a display device according to some example embodiments.
Figure 21:
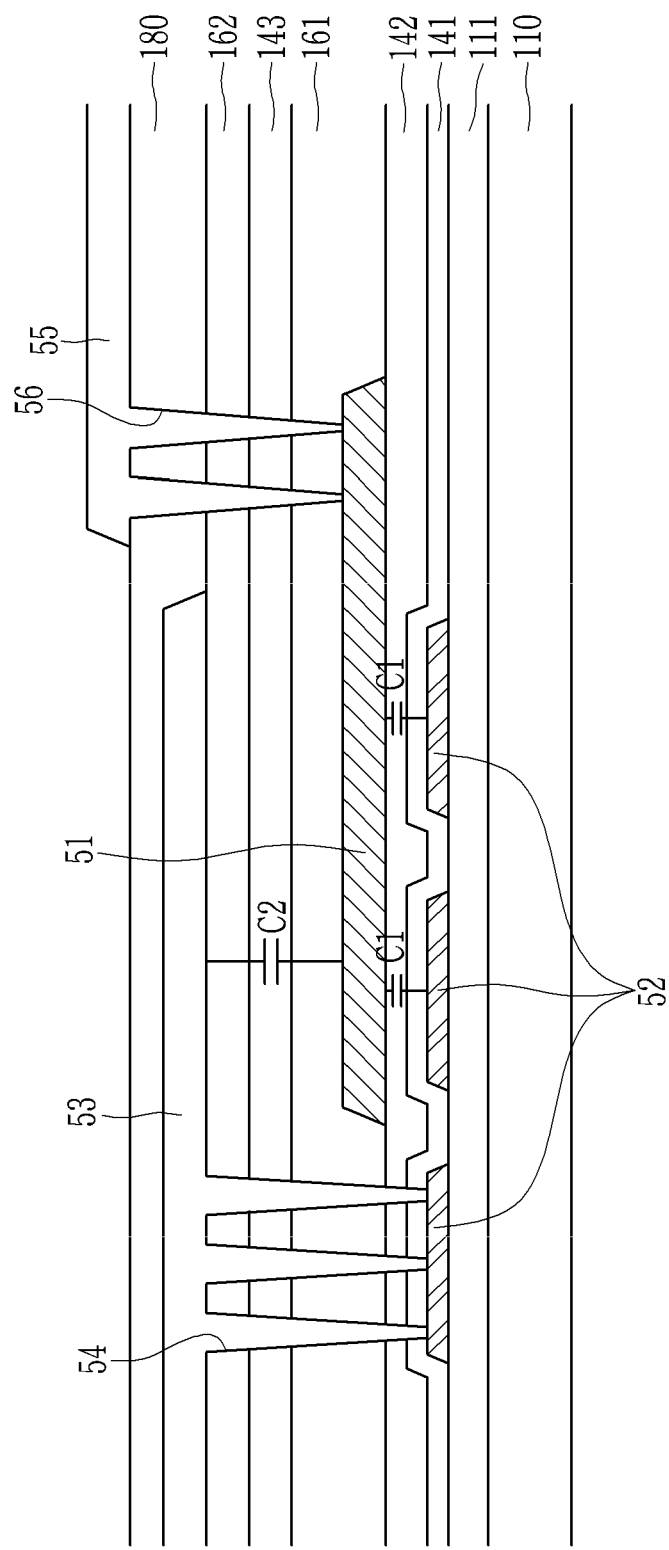
FIG. 21 is a cross-sectional view taken along a line XXI-XXI of FIG. 20.

FIG. 18 is a top plan view showing a partial region of a display device according to some example embodiments, and FIG. 19 is a cross-sectional view taken along a line XIX-XIX of FIG. 18. FIG. 20 is a top plan view showing a partial region of a display device according to some example embodiments, and FIG. 21 is a cross-sectional view taken along a line XXI-XXI of FIG. 20.

As shown in FIG. 18, the display device according to some example embodiments includes a plurality of pixels PX, a plurality of scan lines 11 connected to a plurality of pixels PX, and a load adjusting portion 50 connected to the scan line 11 located on both sides of the notch portion NP.

The display device according to some example embodiments may further include a plurality of signal lines 12 connected to a plurality of pixels PX, and a connection wiring portion 20 connecting the signal line 12 located at the left of the notch portion NP and the signal line 12 located at the right of the notch portion NP.

The display device according to some example embodiments may further include load connection wiring 55 connecting the scan line 11 and the load adjusting portion 50. The load connection wiring 55 may be located to be adjacent to the connection wiring portion 20. In the previous example embodiment, it is described that the load connection wiring 55 does not overlap the connection wiring portion 20, however in the present example embodiment, the load connection wiring 55 may overlap the connection wiring portion 20.

When the load connection wiring 55 does not overlap the connection wiring portion 20, instances of a short between the load connection wiring 55 and the connection wiring portion 20 may be prevented or reduced. Furthermore, in the connection wiring portion 20, the first to fourth connection wires 21, 22, 23, and 24 may be prevented from being shorted. However, in this case, because the area to locate the load connection wiring 55 is relatively small, the number of scan lines 11 that may control the load is also reduced.

When the load connection wiring 55 overlaps the connection wiring portion 20, the area capable of including the load connection wiring 55 may be widely ensured. Therefore, it is possible to control the load of more scan lines 11 and the area to reduce a luminance deviation may be widened.

As shown in FIG. 19, the connection wiring portion 20 may include a first connection wire 21, a second connection wire 22, a third connection wire 23, and a fourth connection wire 24, which are located in the different layers. In this case, the load connection wiring 55 may overlap at least one among the first connection wire 21, the second connection wire 22, the third connection wire 23, or the fourth connection wire 24.

The first connection wire 21 may be located in the first gate conductive layer. The first connection wire 21 may be located between the first gate insulating layer 141 and the second gate insulating layer 142. The second connection wire 22 may be located on the second gate conductive layer. The second connection wire 22 may be located between the second gate insulating layer 142 and the first interlayer insulating layer 161. The first connection wire 21 and the second connection wire 22 may be located in the layers adjacent to each other via the second gate insulating layer 142. The first connection wire 21 and the second connection wire 22 may not overlap on a cross-section.

The third connection wire 23 may be located in the third gate conductive layer. The third connection wire 23 may be located between the third gate insulating layer 143 and the second interlayer insulating layer 162. The fourth connection wire 24 may be located in the first data conductive layer. The fourth connection wire 24 may be located between the second interlayer insulating layer 162 and the third interlayer insulating layer 180. The third connection wire 23 and the fourth connection wire 24 may be located in the layers adjacent to each other via the second interlayer insulating layer 162. The third connection wire 23 and the fourth connection wire 24 may not overlap each other on a cross-section.

The load connection wiring 55 may be located in the second data conductive layer. The load connection wiring 55 may be located on the third interlayer insulating layer 180. The fourth connection wire 24 and the load connection wiring 55 may be located in the layers adjacent to each other via the third interlayer insulating layer 180. The fourth connection wire 24 and the load connection wiring 55 may not overlap each other on a cross-section.

As shown in FIG. 20 and FIG. 21, the load adjusting portion 50 is connected to the load connection wiring 55. The load adjusting portion 50 may include the load adjusting wiring 51, the first load adjusting electrode 52, and the second load adjusting electrode 53.

The plurality of load adjusting wires 51 may be extended in the first direction on a plane, and the first direction may be the row direction. The load adjusting wiring 51 may be located in the second gate conductive layer. The load adjusting wiring 51 may be located between the second gate insulating layer 142 and the first interlayer insulating layer 161.

The load adjusting wiring 51 may be connected to the load connection wiring 55. The load adjusting wiring 51 may be located on a different layer from the load connection wiring 55. The load adjusting wiring 51 and the load connection wiring 55 may partially overlap. For example, the end part of the load adjusting wiring 51 and the end part of the load connection wiring 55 may overlap each other. The insulating layer may be located between the load adjusting wiring 51 and the load connection wiring 55. For example, the first interlayer insulating layer 161, the third gate insulating layer 143, the second interlayer insulating layer 162, and the third interlayer insulating layer 180 may be located between the load adjusting wiring 51 and the load connection wiring 55. The insulating layer located between the load adjusting wiring 51 and the load connection wiring 55 may include the opening 56. The opening 56 may be formed in the first interlayer insulating layer 161, the third gate insulating layer 143, the second interlayer insulating layer 162, and the third interlayer insulating layer 180. The opening 54 may overlap the load adjusting wiring 51 and the load connection wiring 55. The load connection wiring 55 may be located within the opening 54. The load connection wiring 55 may be connected to the load adjusting wiring 51 through the opening 56. The load adjusting wiring 51 may be connected to the scan line 11 through the load connection wiring 55. Accordingly, the signal applied to the scan line 11 may be transmitted to the load adjusting wiring 51.

The plurality of first load adjusting electrodes 52 may be extended in the second direction on a plane, and the second direction may cross the first direction. For example, the second direction may be the column direction. The first load adjusting electrode 52 may overlap the load adjusting wiring 51. The first load adjusting electrode 52 may be located in the different layer from the load adjusting wiring 51. The first load adjusting electrode 52 may be located in the polycrystalline semiconductor layer. The first load adjusting electrode 52 may be located between the buffer layer 111 and the first gate insulating layer 141. The first load adjusting electrode 52 may be located below the load adjusting wiring 51. The insulating layer may be located between the first load adjusting electrode 52 and the load adjusting wiring 51. For example, the first gate insulating layer 141 and the second gate insulating layer 142 may be located between the first load adjusting electrode 52 and the load adjusting wiring 51.

The second load adjusting electrode 53 may be entirely located on the load adjusting portion 50. The second load adjusting electrode 53 may overlap the load adjusting wiring 51. The second load adjusting electrode 53 may be located on the different layer from the load adjusting wiring 51. The second load adjusting electrode 53 may be located in the first data conductive layer. The second load adjusting electrode 53 may be located between the second interlayer insulating layer 162 and the third interlayer insulating layer 180. The second load adjusting electrode 53 may be located on the load adjusting wiring 51. The insulating layer may be located between the second load adjusting electrode 53 and the load adjusting wiring 51. For example, the first interlayer insulating layer 161, the third gate insulating layer 143, and the second interlayer insulating layer 162 may be located between the second load adjusting electrode 53 and the load adjusting wiring 51.

The insulating layer may be located between the first load adjusting electrode 52 and the second load adjusting electrode 53. For example, the first gate insulating layer 141, the second gate insulating layer 142, the first interlayer insulating layer 161, the third gate insulating layer 143, and the second interlayer insulating layer 162 may be located between the first load adjusting electrode 52 and the second load adjusting electrode 53. The insulating layer located between the first load adjusting electrode 52 and the second load adjusting electrode 53 may include the opening 54. The opening 54 may be formed in the first gate insulating layer 141, the second gate insulating layer 142, the first interlayer insulating layer 161, the third gate insulating layer 143, and the second interlayer insulating layer 162. The opening 54 does not overlap the load adjusting wiring 51. The second load adjusting electrode 53 may be located within the opening 54. The second load adjusting electrode 53 may be connected to the first load adjusting electrode 52 through the opening 54. The first load adjusting electrode 52 and the second load adjusting electrode 53 may be connected at the portion where the first load adjusting electrode 52 and the second load adjusting electrode 53 overlap each other, and the first load adjusting electrode 52 and the second load adjusting electrode 53 do not overlap the load adjusting wiring 51. The driving voltage ELVDD may be applied to the first load adjusting electrode 52 and/or the second load adjusting electrode 53.

The first load adjusting electrode 52 and the load adjusting wiring 51 are overlapped via the insulating layer, thereby forming the first capacitor C1. Also, the second load adjusting electrode 53 and the load adjusting wiring 51 are overlapped via the insulating layer, thereby forming the second capacitor C2. By adjusting the capacitance of the first capacitor C1 and the second capacitor C2 of the load adjusting portion 50, the load of the scan line 11 connected to the load adjusting portion 50 may be controlled, thereby preventing or reducing the occurrence of a luminance difference in the first region P1 and the second region P2.

In the above, a plurality of first load adjusting electrodes 52 are extended side by side, the second load adjusting electrode 53 has the total plate shape overlapping a plurality of load adjusting wires 51 and a plurality of first load adjusting electrodes 52, however it is not limited thereto and may be variously changed.

Hereinafter, an example variation of the display device according to some example embodiments, as illustrated in FIGS. 18 to 21 described above is described with reference to FIGS. 22 and 23.

Figure 22:
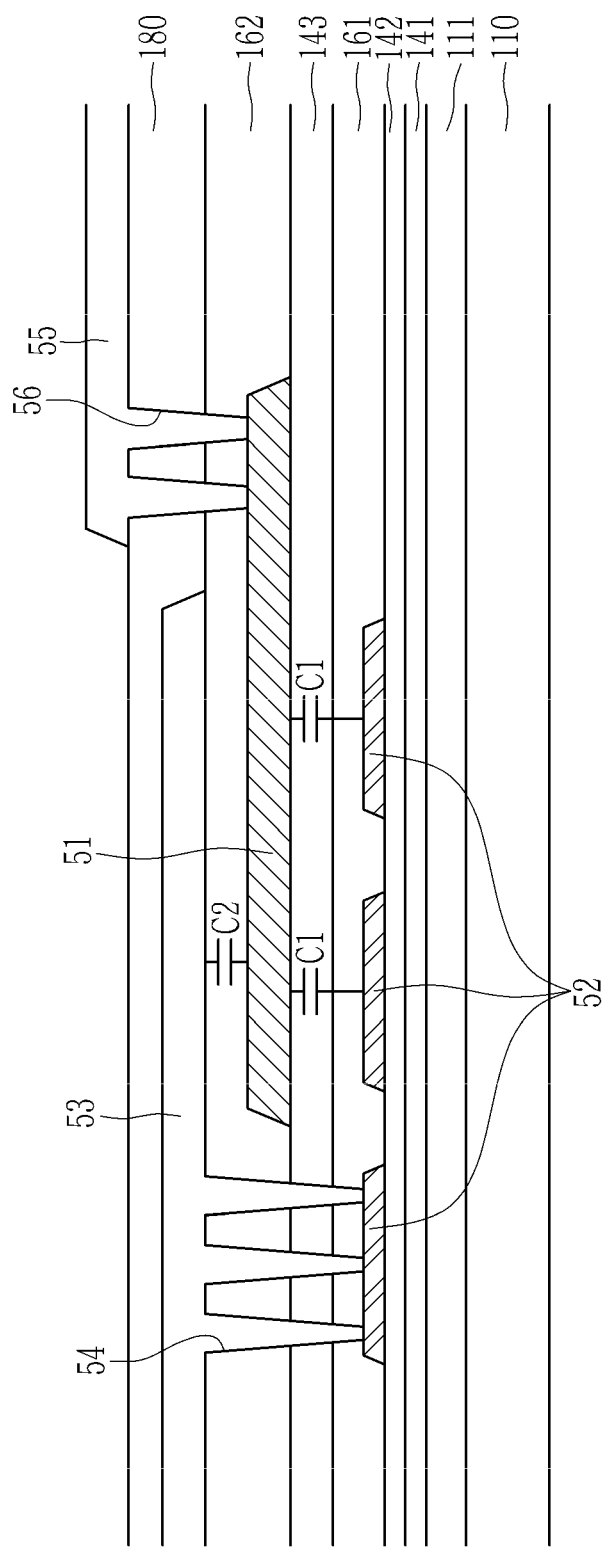
FIG. 22 and FIG. 23 are cross-sectional views showing a partial region of a display device according to some example embodiments.
Figure 23:
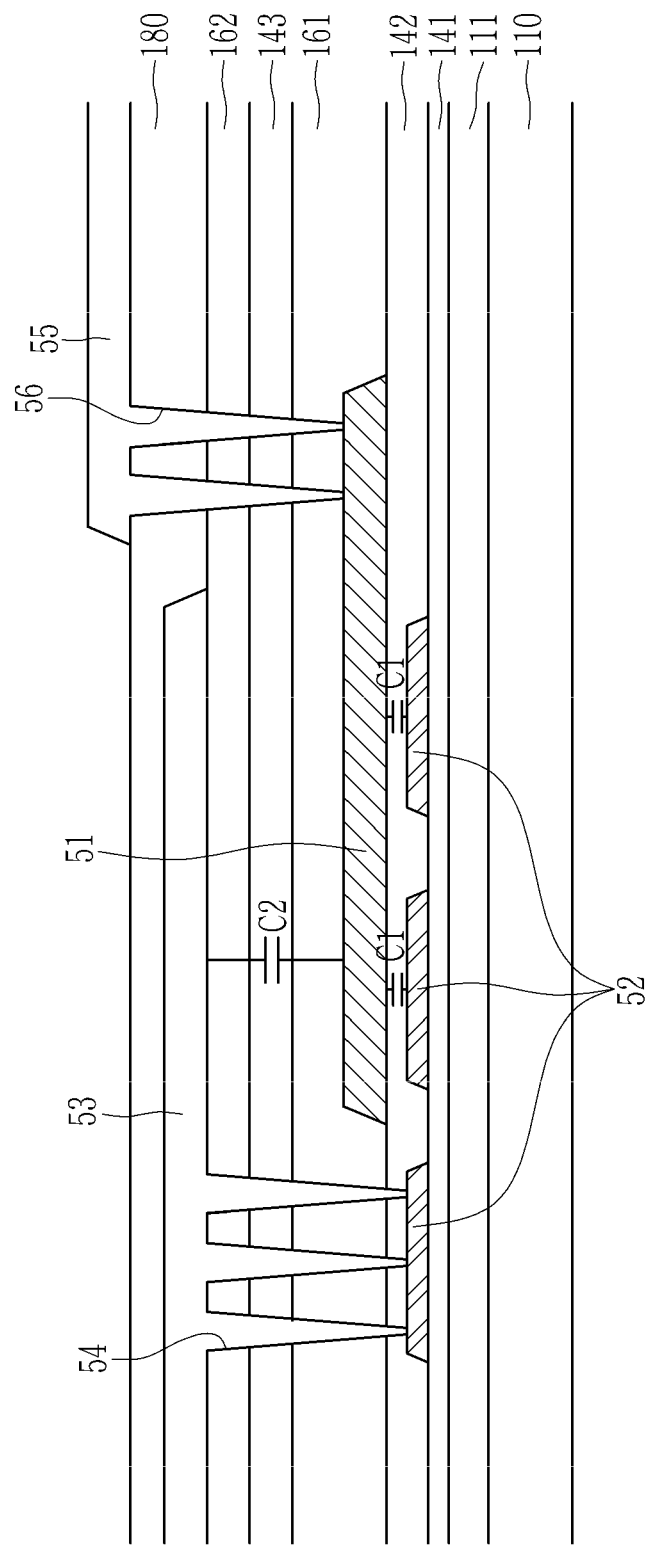

FIG. 22 and FIG. 23 are cross-sectional views showing a partial region of a display device according to some example embodiments. FIG. 22 and FIG. 23 show numerous example variations of the cross-section shape of the load adjusting portion of the display device according to some example embodiments as shown in FIG. 21.

The load adjusting portion 50 of the display device according to some example embodiments as shown in FIG. 21 includes load adjusting wiring 51 located in the second gate conductive layer, a first load adjusting electrode 52 located in the polycrystalline semiconductor layer, and a second load adjusting electrode 53 located in the first data conductive layer. The layers in which the load adjusting wiring 51, the first load adjusting electrode 52, and the second load adjusting electrode 53 of the load adjusting portion 50 of the display device according to some example embodiments may be variously changed, and an example is described.

As shown in FIG. 22, the load adjusting portion 50 of the display device according to some example embodiments may include the load adjusting wiring 51 located in the third gate conductive layer, the first load adjusting electrode 52 located in the second gate conductive layer, and the second load adjusting electrode 53 located in the first data conductive layer.

The insulating layer may be located between the load adjusting wiring 51 and the load connection wiring 55. For example, the second interlayer insulating layer 162 and the third interlayer insulating layer 180 may be located between the load adjusting wiring 51 and the load connection wiring 55. The insulating layer located between the load adjusting wiring 51 and the load connection wiring 55 may include an opening 56. The opening 56 may be formed in the second interlayer insulating layer 162 and the third interlayer insulating layer 180. The opening 54 may overlap the load adjusting wiring 51 and the load connection wiring 55. The load connection wiring 55 may be located within the opening 54. The load connection wiring 55 may be connected to the load adjusting wiring 51 through the opening 56.

The insulating layer may be located between the first load adjusting electrode 52 and the load adjusting wiring 51. For example, the first interlayer insulating layer 161 and the third gate insulating layer 143 may be located between the first load adjusting electrode 52 and the load adjusting wiring 51.

The insulating layer may be located between the second load adjusting electrode 53 and the load adjusting wiring 51. For example, the second interlayer insulating layer 162 may be located between the second load adjusting electrode 53 and the load adjusting wiring 51.

The insulating layer may be located between the first load adjusting electrode 52 and the second load adjusting electrode 53. For example, the first interlayer insulating layer 161, the third gate insulating layer 143, and the second interlayer insulating layer 162 may be located between the first load adjusting electrode 52 and the second load adjusting electrode 53. The insulating layer located between the first load adjusting electrode 52 and the second load adjusting electrode 53 may include an opening 54. The opening 54 may be formed in the first interlayer insulating layer 161, the third gate insulating layer 143, and the second interlayer insulating layer 162. The opening 54 does not overlap the load adjusting wiring 51. The second load adjusting electrode 53 may be located within the opening 54. The second load adjusting electrode 53 may be connected to the first load adjusting electrode 52 through the opening 54.

According to some example embodiments, as shown in FIG. 23, the load adjusting portion 50 of the display device according to some example embodiments may include the load adjusting wiring 51 located in the second gate conductive layer, the first load adjusting electrode 52 located in the first gate conductive layer, and the first second load adjusting electrode 53 located in the data conductive layer.

The insulating layer may be located between the load adjusting wiring 51 and the load connection wiring 55. For example, the first interlayer insulating layer 161, the third gate insulating layer 143, the second interlayer insulating layer 162, and the third interlayer insulating layer 180 may be located between the load adjusting wiring 51 and the load connection wiring 55. The insulating layer located between the load adjusting wiring 51 and the load connection wiring 55 may include an opening 56. The opening 56 may be formed in the first interlayer insulating layer 161, the third gate insulating layer 143, the second interlayer insulating layer 162, and the third interlayer insulating layer 180. The opening 54 may overlap the load adjusting wiring 51 and the load connection wiring 55. The load connection wiring 55 may be located within the opening 54. The load connection wiring 55 may be connected to the load adjusting wiring 51 through the opening 56.

The insulating layer may be located between the first load adjusting electrode 52 and the load adjusting wiring 51. For example, the second gate insulating layer 142 may be located between the first load adjusting electrode 52 and the load adjusting wiring 51.

The insulating layer may be located between the second load adjusting electrode 53 and the load adjusting wiring 51. For example, the first interlayer insulating layer 161, the third gate insulating layer 143, and the second interlayer insulating layer 162 may be located between the second load adjusting electrode 53 and the load adjusting wiring 51.

The insulating layer may be located between the first load adjusting electrode 52 and the second load adjusting electrode 53. For example, the second gate insulating layer 142, the first interlayer insulating layer 161, the third gate insulating layer 143, and the second interlayer insulating layer 162 may be located between the first load adjusting electrode 52 and the second load adjusting electrode 53. The insulating layer located between the first load adjusting electrode 52 and the second load adjusting electrode 53 may include an opening 54. The opening 54 may be formed in the second gate insulating layer 142, the first interlayer insulating layer 161, the third gate insulating layer 143, and the second interlayer insulating layer 162. The opening 54 does not overlap the load adjusting wiring 51. The second load adjusting electrode 53 may be located within the opening 54. The second load adjusting electrode 53 may be connected to the first load adjusting electrode 52 through the opening 54.

While this disclosure has been described in connection with what is presently considered to be practical example embodiments, it is to be understood that embodiments according to the present invention are not limited to the disclosed example embodiments. On the contrary, it is intended to cover various modifications and equivalent arrangements included within the spirit and scope of the appended claims and their equivalents.

DESCRIPTION OF SOME OF THE REFERENCE SYMBOLS

11: scan line
12: signal line
20: connection wiring portion
21: first connection wire
22: second connection wire
23: third connection wire
24: fourth connection wire
50: load adjusting portion
51: load adjusting wiring
52: first load adjusting electrode
53: second load adjusting electrode
54, 56: opening
110: substrate

What is claimed is:

1. A display device including a notch portion of a non-emission region, the display device comprising:
a plurality of pixels;
a plurality of scan lines connected to the plurality of pixels;
a load adjusting portion connected to the scan lines on both sides of the notch portion and adjacent to an upper end portion of the notch portion,
a plurality of signal lines connected to the plurality of pixels;
a connection wiring portion along an edge of the notch portion to connect the signal line at the left of the notch portion and the signal line at the right of the notch portion; and
a load connection wiring connecting the scan line and the load adjusting portion,
wherein the load connection wiring is adjacent to the connection wiring portion,
wherein the load adjusting portion includes:
a load adjusting wiring connected to the scan lines on both sides of the notch portion;
a first load adjusting electrode in a different layer from the load adjusting wiring and overlapping the load adjusting wiring; and
a second load adjusting electrode in a different layer from the load adjusting wiring and the first load adjusting electrode and overlapping the load adjusting wiring,
wherein the connection wiring portion includes a first connection wire, a second connection wire, a third connection wire, and a fourth connection wire in different layers,
the first connection wire and the second connection wire, which are in adjacent layers, do not overlap each other on a cross-section, and
the third connection wire and the fourth connection wire, which are in the adjacent layers, do not overlap each other on a cross-section.

2. The display device of claim 1, wherein
the load adjusting portion is adjacent to a lower end portion of the notch portion.

3. The display device of claim 1, wherein
the scan lines and the load adjusting wiring extend in a first direction,
the first load adjusting electrode extends in a second direction crossing the first direction, and
the second load adjusting electrode is entirely on the load adjusting portion.

4. The display device of claim 3, further comprising:
a first insulating layer between the first load adjusting electrode and the load adjusting wiring; and
a second insulating layer between the second load adjusting electrode and the load adjusting wiring,
wherein the first load adjusting electrode is below the load adjusting wiring, and
the second load adjusting electrode is on the load adjusting wiring.

5. The display device of claim 1, wherein
a number of the pixels connected to the scan lines on both sides of the notch portion is smaller than a number of the pixels connected to the scan lines on a remaining region except for both sides of the notch portion.

6. The display device of claim 1, further comprising
a polycrystalline semiconductor layer, a first gate conductive layer, a second gate conductive layer, an oxide semiconductor layer, a third gate conductive layer, a first data conductive layer, and a second data conductive layer, which are sequentially formed,
the first connection wire is in the first gate conductive layer,
the second connection wire is in the second gate conductive layer,
the third connection wire is in the first data conductive layer, and
the fourth connection wire is in the second data conductive layer.

7. The display device of claim 6, wherein
the load adjusting wiring is in the third gate conductive layer,
the first load adjusting electrode is in the second gate conductive layer, and
the second load adjusting electrode is in the first data conductive layer.

8. The display device of claim 7, wherein
the load connection wiring is in the third gate conductive layer to be formed integrally with the load adjusting wiring and does not overlap the connection wiring portion.

9. The display device of claim 1, further comprising
a light emission control line, a bypass control line, and an initialization control line connected to the plurality of pixels,
wherein the scan lines include a first scan line and a second scan line, and
the load adjusting portion is connected to the first scan line or the second scan line.

10. The display device of claim 9, wherein
the first connection wire connects a light emission control line at the left of the notch portion and a light emission control line at the right side of the notch portion,
the second connection wire connects a bypass control line at the left of the notch portion and a bypass control line at the right side of the notch portion,
the third connection wire connects an initialization control line at the left side of the notch portion and an initialization control line at the right side of the notch portion, and
the fourth connection wire connects a second scan line at the left side of the notch portion and a second scan line at the right side of the notch portion, and
the load adjusting portion is connected to the first scan line.

11. The display device of claim 9, wherein each of the plurality of pixels includes:
- a light emitting diode (LED) connected between a driving voltage line configured to receive a driving voltage and a common voltage line configured to receive a common voltage;
- a driving transistor connected between the driving voltage line and the light emitting diode (LED);
- a second transistor connected between a first electrode of the driving transistor connected to the driving voltage line and a data line configured to receive a data voltage;
- a third transistor connected between a second electrode of the driving transistor connected to the light emitting diode (LED) and a gate electrode of the driving transistor; and
- a fourth transistor connected between a gate electrode of the driving transistor and a first initialization voltage line configured to receive a first initialization voltage,
- the driving transistor and the second transistor include a polycrystalline semiconductor, and
- the third transistor and the fourth transistor include an oxide semiconductor.

12. The display device of claim 11, wherein
the gate electrode of the second transistor is connected to the first scan line,
the gate electrode of the third transistor is connected to the second scan line, and
the gate electrode of the fourth transistor is connected to the initialization control line.

13. The display device of claim 12, wherein each of the plurality of pixels further includes:
- a fifth transistor connected between the driving voltage line and the driving transistor; and
- a seventh transistor connected between the light emitting diode (LED) and a second initialization voltage line to which a second initialization voltage is applied,
- wherein the gate electrode of the fifth transistor is connected to the light emission control line, and
- the gate electrode of the seventh transistor is connected to the bypass control line.

14. The display device of claim 1, further comprising
at least one of a camera, a proximity sensor, an illuminance sensor, a gesture sensor, a motion sensor, a fingerprint sensor, or a biological sensor, or a combination thereof, positioned at the notch portion.

15. A display device including a notch portion of a non-emission region, the display device comprising:
- a plurality of pixels;
- a plurality of scan lines connected to the plurality of pixels;
- a load adjusting portion connected to the scan lines on both sides of the notch portion and adjacent to an upper end portion of the notch portion; and
- a polycrystalline semiconductor layer, a first gate conductive layer, a second gate conductive layer, an oxide semiconductor layer, a third gate conductive layer, a first data conductive layer, and a second data conductive layer, which are sequentially formed,
- wherein the load adjusting portion includes:
- a load adjusting wiring connected to the scan lines on both sides of the notch portion;
- a first load adjusting electrode in a different layer from the load adjusting wiring and overlapping the load adjusting wiring; and
- a second load adjusting electrode in a different layer from the load adjusting wiring and the first load adjusting electrode and overlapping the load adjusting wiring, and
- wherein the load connection wiring is in the second data conductive layer.

16. The display device of claim 15, wherein
the load connection wiring overlaps a connection wiring portion.

17. The display device of claim 15, wherein
- a connection wiring portion includes a first connection wire, a second connection wire, a third connection wire, and a fourth connection wire, which are in different layers,
- the first connection wire is in the first gate conductive layer,
- the second connection wire is in the second gate conductive layer,
- the third connection wire is in the third gate conductive layer, and
- the fourth connection wire is in the first data conductive layer.

18. The display device of claim 17, wherein
- the load adjusting wiring is in the second gate conductive layer,
- the first load adjusting electrode is in the polycrystalline semiconductor layer, and
- the second load adjusting electrode is in the first data conductive layer.

19. The display device of claim 17, wherein
- the load adjusting wiring is in the third gate conductive layer,
- the first load adjusting electrode is in the second gate conductive layer, and
- the second load adjusting electrode is in the first data conductive layer.

20. A display device including a notch portion of a non-emission region, comprising:
- a plurality of pixels;
- a plurality of scan lines connected to the plurality of pixels; and
- a load adjusting portion connected to scan lines on both sides of the notch portion,
- wherein the load adjusting portion includes:
- a load adjusting wiring connected to the scan lines on both sides of the notch portion;
- a plurality of signal lines connected to the plurality of pixels;
- a connection wiring portion along an edge of the notch portion to connect the signal line at the left of the notch portion and the signal line at the right of the notch portion; and
- a load connection wiring connecting the scan line and the load adjusting portion,
- wherein the load connection wiring is adjacent to the connection wiring portion;
- a first load adjusting electrode under the load adjusting wiring and overlapping the load adjusting wiring;
- a first insulating layer between the load adjusting wiring and the first load adjusting electrode;
- a second load adjusting electrode on the load adjusting wiring and overlapping the load adjusting wiring; and
- a second insulating layer between the load adjusting wiring and the second load adjusting electrode, wherein the connection wiring portion includes a first connection wire, a second connection wire, a third connection wire, and a fourth connection wire in different layers, the first connection wire and the second connection wire, which are in adjacent layers, do not overlap each other on a cross-section, and the third connection wire and the fourth connection wire, which are in the adjacent layers, do not overlap each other on a cross-section.

* * * * *